United States Patent
Kiwanami et al.

(10) Patent No.: US 9,313,894 B2
(45) Date of Patent: Apr. 12, 2016

(54) WIRING SUBSTRATE AND MANUFACTURING METHOD OF WIRING SUBSTRATE

(71) Applicant: SHINKO ELECTRIC INDUSTRIES CO., LTD., Nagano-ken (JP)

(72) Inventors: Takayuki Kiwanami, Nagano (JP); Junji Sato, Nagano (JP); Katsuya Fukase, Nagano (JP)

(73) Assignee: Shinko Electric Industries Co., Ltd., Nagano-shi, Nagano-ken (JP)

(*) Notice: Subject to any disclaimer, the term of this patent is extended or adjusted under 35 U.S.C. 154(b) by 0 days.

(21) Appl. No.: 14/295,721

(22) Filed: Jun. 4, 2014

(65) Prior Publication Data
US 2014/0360760 A1   Dec. 11, 2014

(30) Foreign Application Priority Data
Jun. 10, 2013   (JP) ................... 2013-121872

(51) Int. Cl.
| H05K 1/16 | (2006.01) |
| H05K 1/18 | (2006.01) |
| H05K 3/46 | (2006.01) |
| H05K 1/11 | (2006.01) |

(52) U.S. Cl.
CPC ............. *H05K 1/185* (2013.01); *H05K 1/182* (2013.01); *H05K 3/4697* (2013.01); *H05K 1/113* (2013.01); *H05K 1/18* (2013.01); *H05K 3/4602* (2013.01); *H05K 3/4644* (2013.01); *H05K 2201/10636* (2013.01); *Y02P 70/611* (2015.11)

(58) Field of Classification Search
CPC ... H05K 1/185; H05K 1/0298; H05K 3/4697; H05K 3/4602; H05K 2201/10636; H05K 3/4644
USPC ................ 174/250–268; 361/760, 792–795
See application file for complete search history.

(56) References Cited

U.S. PATENT DOCUMENTS

| 2006/0186536 A1* | 8/2006 | Hsu .................. H01L 23/36 257/720 |
| 2006/0272853 A1* | 12/2006 | Muramatsu ......... H05K 1/0231 174/262 |
| 2009/0215231 A1* | 8/2009 | Inoue ................ H01L 23/5389 438/125 |
| 2010/0300737 A1 | 12/2010 | Sato et al. |

FOREIGN PATENT DOCUMENTS

| JP | 2011-216740 | 10/2011 |
| WO | WO 2010/137421 | 12/2010 |

* cited by examiner

*Primary Examiner* — Ishwarbhai B Patel
(74) *Attorney, Agent, or Firm* — Fish & Richardson P.C.

(57) ABSTRACT

A wiring substrate includes a core, a first wiring layer formed on a first surface of the core, a second wiring layer formed on a second surface of the core, and an electronic component partially accommodated in the cavity and including a projected portion projected from the first opening of the core. A first insulating layer covers a side surface of the electronic component and the first surface of the core and fills a portion of the cavity. A second insulating layer covers the first insulating layer. A third insulating layer covers the second surface of the core. The remainder of the cavity that is not filled with the first insulating layer is filled with the third insulating layer.

6 Claims, 11 Drawing Sheets

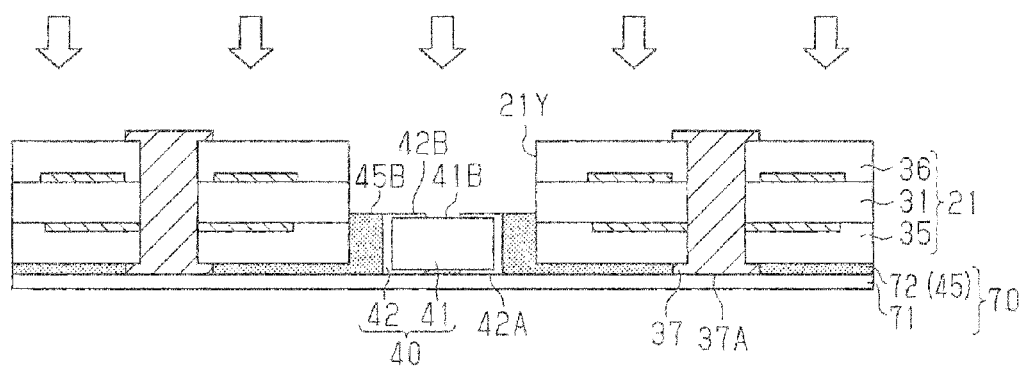
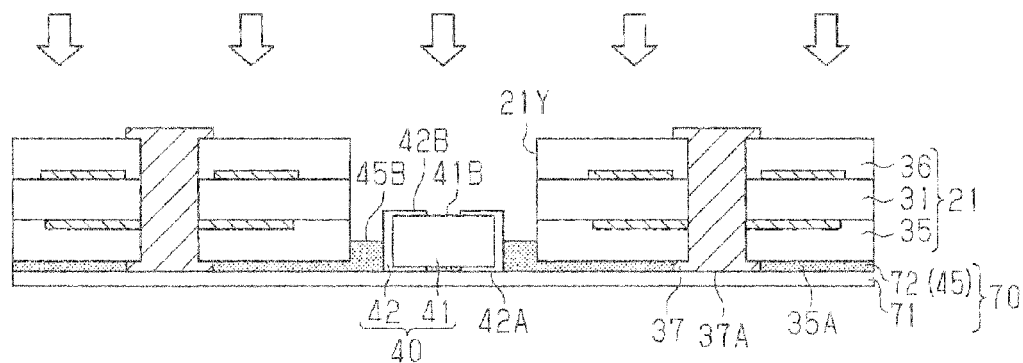

WIRING SUBSTRATE AND MANUFACTURING METHOD OF WIRING SUBSTRATE

CROSS-REFERENCE TO RELATED APPLICATIONS

This application is based upon and claims the benefit of priority from prior Japanese Patent Application No. 2013-121872, filed on Jun. 10, 2013, the entire contents of which are incorporated herein by reference.

FIELD

The present disclosure relates to a wiring substrate and a manufacturing method of a wiring substrate.

BACKGROUND

Japanese Laid-Open Patent Publication No. 2011-216740 describes an example of wiring substrate incorporating an electronic component such as a semiconductor chip. The wiring substrate includes a core substrate having a cavity, an electronic component arranged in the cavity, and build-up layers formed on the two opposite surfaces of the core substrate. The electronic component is encapsulated in an insulative resin material that fills the cavity. The electronic component is electrically connected to wires in the build-up layers through vias formed in the build-up layers.

A manufacturing method of the wiring substrate will now be described. First, as illustrated in FIG. 12A, a cavity 90X is formed in a core substrate 90. A temporary fastening tape 91 is applied to a lower surface 90A of the core substrate 90 to close the cavity 90X, and an electronic component 92 is arranged on the tape 91 in the cavity 90X. Then, referring to FIG. 12B, vacuum lamination, vacuum hot pressing, or the like is performed to fill the cavity 90X and cover an upper surface 90B of the core substrate 90 with an insulating layer 93. Subsequently, as illustrated in FIG. 12C, the tape 91 is removed from the core substrate 90. Then, as illustrated in FIG. 12D, an insulating layer 94 is stacked on the lower surface 90A of the core substrate 90, to which the tape 91 had been attached. Laser processing, for example, is performed to form via holes VH11 and VH12 in the insulating layers 94 and 93, respectively. Subsequently, a semi-additive process, for example, is performed to form wiring layers 95 and 96. Then, a certain number of insulating layers and wiring layers are stacked on the insulating layers 94 and 93.

SUMMARY

When the volume of the cavity 90X accommodating the electronic component 92 increases, the insulating layer 93 may not be able to sufficiently fill the cavity 90X. In such a case, dishing may occur in the insulating layer 93 immediately above the cavity 90X. This may adversely affect the formation of the wiring layer 96 on the insulating layer 93.

One aspect of the present disclosure is a wiring substrate including a core. The core includes a first surface, a second surface, and a cavity. The second surface is located at an opposite side of the first surface, and the cavity includes a first opening in the first surface and a second opening in the second surface. A first wiring layer is formed on the first surface of the core. A second wiring layer is formed on the second surface of the core. An electronic component is partially accommodated in the cavity and includes a projected portion projected from the first opening of the core. A first insulating layer covers at least a portion of a side surface of the electronic component and the first surface of the core and fills a portion of the cavity. A portion of the cavity is filled with the first insulating layer. A second insulating layer covers a first surface of the first insulating layer. A first via wire extends through the second insulating layer. A third insulating layer covers the second surface of the core. The remainder of the cavity that is not filled with the first insulating layer is filled with the third insulating layer. A third wiring layer is formed on the second insulating layer and electrically connected to the electronic component through at least the first via wire. A second via wire extends through the third insulating layer. A fourth wiring layer is formed on the third insulating layer and electrically connected to the second wiring layer through the second via wire.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 9A is a schematic cross-sectional view illustrating a manufacturing method of a wiring substrate of a third modification;

FIG. 9B is a schematic cross-sectional view illustrating a manufacturing method of a wiring substrate of a fourth modification;

DETAILED DESCRIPTION OF EMBODIMENTS

Figure 1:
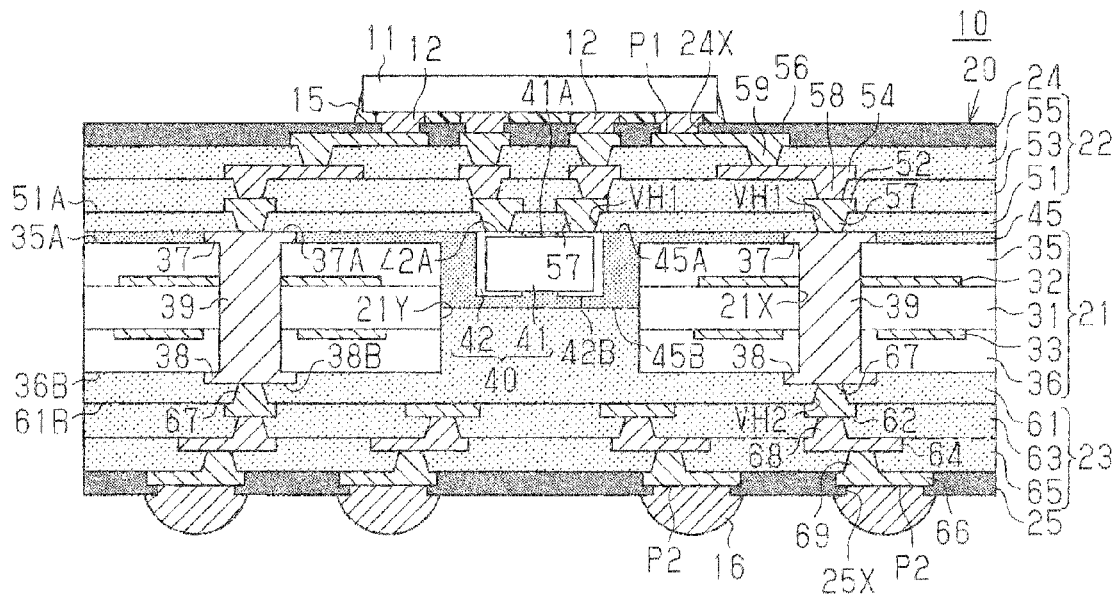
FIG. 1 is a schematic cross-sectional view of a semiconductor device including a wiring substrate of a first embodiment taken along line 1-1 in FIG. 2.

In the drawings, elements are illustrated for simplicity and clarity and have not necessarily been drawn to scale. To facilitate understanding, hatching lines may not be illustrated in the cross-sectional drawings and screentones may be used instead.

As illustrated in FIG. 1, a semiconductor device 10 includes a wiring substrate 20, a semiconductor chip 11 mounted on the wiring substrate 20, and an underfill resin 15 formed in a gap between the wiring substrate 20 and the semiconductor chip 11.

The wiring substrate 20 includes a core 21, a chip capacitor 40 incorporated in the wiring substrate 20, an insulating layer 45 that covers the first surface 35A (e.g., upper surface) of the core 21, a wiring structure 22 formed on a first surface 45A of the insulating layer 45, a wiring structure 23 formed on a second surface 36B of the core 21, a solder resist layer 24 that covers the wiring structure 22, and a solder resist layer 25 that covers the wiring structure 23.

The core 21 is, for example, a multi-layer printed wiring board. The core 21 includes a core substrate 31, inner wiring layers 32 and 33, insulating layers 35 and 36, outer wiring layers 37 and 38, and through-core electrodes 39. Each of the outer wiring layers 37 and 38 serve as the outer surface of the core 21. In the illustrated example, the first surface 35A of the core 21 corresponds to the outer surface of the insulating layer 35, and a second surface 36B of the core 21 corresponds to the outer surface of the insulating layer 36. The thickness of the core 21 conforms to the distance from the first surface 35A of the insulating layer 35 to the second surface 36B of the insulating layer 36 and is, for example, about 300 to 800 µm.

The core substrate 31 may be a so-called glass epoxy substrate that is formed by impregnating, for example, a glass cloth (glass woven cloth), which is a reinforcement material, with a thermosetting insulative resin, of which the main component is epoxy resin, and then hardening the glass cloth. The reinforcement material is not limited to glass cloth, and may be, for example, glass nonwoven cloth, aramid woven cloth, aramid nonwoven cloth, liquid crystal polymer (LAP) woven cloth, or LAP nonwoven cloth. The thermosetting insulative resin may be an insulative resin other than the epoxy resin such as polyimide resin, cyanide resin, or the like.

The wiring layer 32 is formed on a first surface (e.g., upper surface) of the core substrate 31, and the wiring layer 33 is formed on a second surface (e.g., lower surface) of the core substrate 31. The wiring layers 32 and 33 include, for example, a power line and a ground line. The insulating layer 35 covers the wiring layer 32, which is stacked on the first surface of the core substrate 31. The insulating layer 36 covers the wiring layer 33, which is stacked on the second surface of the core substrate 31. The wiring layers 32 and 33 may be formed from, for example, copper or copper alloy. The insulating layers 35 and 36 may be formed from, for example, an insulative resin such as epoxy resin, polyimide resin, or the like, a composite resin material, in which a filler such as silica, alumina, and the like is mixed with the insulative resin.

Through holes 21X are formed at certain locations (two locations in FIG. 1) in the core 21 (core substrate 31 and insulating layers 35 and 36). Each through hole 21X extends through the core substrate 31 and the insulating layers 35 and 36 in a thicknesswise direction. Each through hole 21X receives one of the through-core electrodes 39. The through-core electrode 39 is, for example, rod-shaped. The through-core electrode 39 has a diameter of, for example, about 50 to 100 µm. The material of the through-core electrode 39 is, for example, copper or copper alloy.

The wiring layer 37 is formed on the first surface 35A of the insulating layer 35 (first surface 35A of the core 21). The wiring layer 38 is formed on the second surface 36B of the insulating layer 36 (second surface 36B of the core 21). The through-core electrodes 39 electrically connect the wiring layers 37 and 38.

Figure 2:
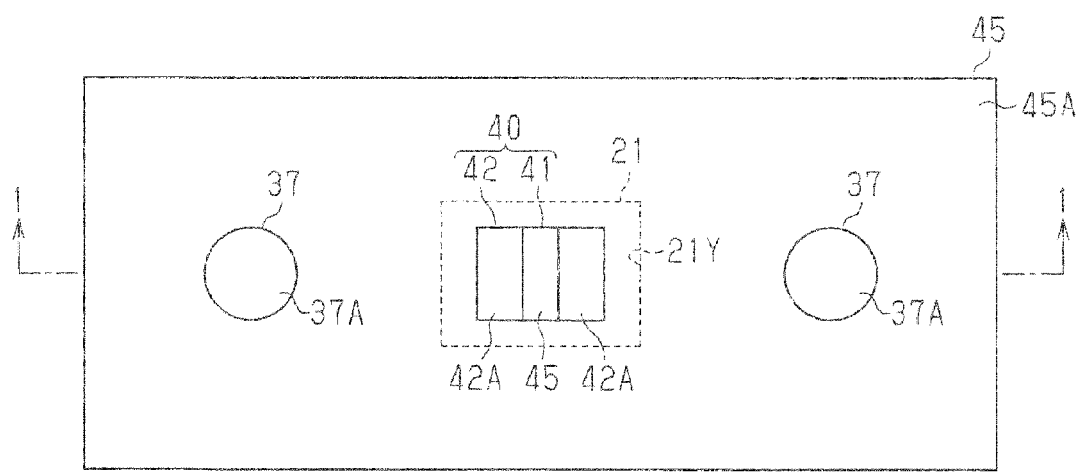
FIG. 2 is a schematic view of a portion of the semiconductor device including the wiring substrate of the first embodiment.

As illustrated in FIG. 2, the wiring layers 37 and 38 are formed to be, for example, substantially circular as viewed from above. The wiring layers 37 and 38 each have a diameter of, for example, about 100 to 150 µm. The wiring layers 37 and 38 each have a thickness of, for example, about 10 to 20 µm. The wiring layers 37 and 38 are formed from, for example, copper or copper alloy. FIG. 2 is a schematic view of the core 21, the chip capacitor 40, and the insulating layer 45 taken from the upper side in FIG. 1.

As illustrated in FIG. 1, the core 21 (core substrate 31 and insulating layers 35, 36) includes a cavity 21Y formed at a certain location (e.g., one location). The cavity 21Y extends through the core 21 (core substrate 31 and insulating layers 35 and 36) in the thicknesswise direction. Further, the cavity 21Y has a first opening in the first surface 35A of the core 21 and a second opening in the second surface 36B of the core 21. The cavity 21Y may be referred to as an accommodation compartment for accommodating the chip capacitor 40.

In the example illustrated in FIG. 2, the cavity 21Y is formed in a central portion of the core 21. The cavity 21Y is shaped in conformance with the chip capacitor 40 and may be, for example, rectangular as viewed from above. The cavity 21Y has a larger footprint than the chip capacitor 40. Thus, the chip capacitor 40 may be arranged away toward the inner side from the wall surface of the cavity 21Y. The cavity 21Y may be, for example, 5 mm×5 mm to 15 mm×15 mm as viewed from above.

As illustrated in FIG. 1, most of the chip capacitor 40 is arranged in the cavity 21Y and the remainder of the chip capacitor 40 projects from the first opening of the cavity 21Y and is arranged in the insulating layer 45. The chip capacitor 40 may include a box-shaped capacitor body 41 and two connection terminals 42, which are formed at the two longitudinal ends of the capacitor body 41. Each connection terminal 42 covers at least a side surface, which includes one end face in the longitudinal direction of the capacitor body 41, a portion of the upper surface, and a portion of the lower surface.

The chip capacitor 40 has a thickness of, for example, 200 to 500 µm. The capacitor body 41 is mainly formed by, for example, an electrode of ceramics, copper, or the like. The connection terminals 42 are formed from, for example, copper or copper alloy.

The chip capacitor 40 projects toward the upper side from the first opening of the cavity 21Y, that is, the core 21, or the first surface 35A of the insulating layer 35. Accordingly, a portion of the capacitor body 41, the entire first surface 42A of the connection terminal 42, and a portion of the side surface of each connection terminal 42 project toward the upper side from the first opening of the cavity 21Y. In the illustrated example, the first surface 42A of each connection terminal 42 is located above the first surface 35A of the insulating layer 35. Further, the first surface 42A of each connection terminal 42 is flush with a first surface 37A of the wiring layer 37. The first surface 42A of each connection terminal 42 and the first surface 37A of the wiring layer 37 is substantially flush with the first surface 45A (e.g., upper surface) of the insulating layer 45.

The surface of the chip capacitor 40 exposed from the insulating layer 45, that is, the first surface 42A of each connection terminal 42, are rough surfaces. In the preferred example, the first surface 42A of each connection terminal 42 is rougher than the surfaces of the chip capacitor 40 covered by the insulating layer 45.

The cavity 21Y is filled with two insulating layers, namely the insulating layer 45 and an interlayer insulating layer 61. The insulating layer 45 fills a portion of the cavity 21Y and covers the first surface 35A of the core 21. In the illustrated example, the insulating layer 45 entirely covers the first surface 35A of the core 21 exposed from the wiring layer 37. Further, the insulating layer 45 covers a portion of the chip capacitor 40. In the illustrated example, the insulating layer 45 covers the second surface 42B of each connection terminal 42, the side surfaces of each connection terminal 42, and the entire capacitor body 41 exposed from the connection terminals 42. Accordingly, in the chip capacitor 40, the portion of each connection terminal 42 excluding the first surface 42A is buried on the insulating layer 45, and only the first surface 42A of the connection terminal 42 of the chip capacitor 40 is exposed from the insulating layer 45. The insulating layer 45 may formed from an insulative resin such as epoxy resin or polyimide resin. The thickness from the first surface 35A (e.g., upper surface) of the insulating layer 35 to the first surface 45A (e.g., upper surface) of the insulating layer 35 is, for example, 15 to 35 μm.

The wiring structure 22 is stacked on the first surface 45A of the insulating layer 45. In the wiring structure 22, wiring layers and interlayer insulating layers are alternately stacked. The wiring layer may have any number of layers. The interlayer insulating layer has a thickness that insulates the wiring layers from each other. In the wiring structure 22 of the present example, the interlayer insulating layer 51, a wiring layer 52, an interlayer insulating layer 53, a wiring layer 54, an interlayer insulating layer 55, and a wiring layer 56 are stacked in this order.

The interlayer insulating layer 51 is formed on the insulating layer 45 and the insulating layer 45. The interlayer insulating layer 51 covers the first surface 42A of each connection terminal 42, the first surface 37A of the wiring layer 37, and the first surface 45A of the insulating layer 45. The material of the interlayer insulating layer 51 is, for example, an insulative resin such as epoxy resin or polyimide resin, or a composite resin material in which a filler such as silica, alumina, or the like is mixed with the insulative resin. The thickness from the first surface 37A of the wiring layer 37 to the first surface 51A (e.g., upper surface) of the interlayer insulating layer 51 is, for example, 15 to 35 μm.

The interlayer insulating layer 51 includes via holes VH1 extending through the interlayer insulating layer 51 to expose the first surface 37A of the wiring layer 37 or the first surface 42A of the connection terminal 42. The via holes VH1 may be referred to as first via holes.

The wiring layer 52 is stacked on the interlayer insulating layer 51. The wiring layer 52 is electrically connected to the wiring layer 37 or the connection terminal 42 through via wires 57 filled in the via hole VH1. In other words, the wiring layer 52 is electrically connected to the wiring layer 37 or the connection terminal 42 through the via wires 57 extending through the interlayer insulating layer 51.

In the same manner, the interlayer insulating layer 53 is formed on the interlayer insulating layer 51 to cover the wiring layer 52. The wiring layer 54 is formed on the interlayer insulating layer 53 and electrically connected to the wiring layer 52 through via wires 58 extending through the interlayer insulating layer 53. The interlayer insulating layer 55, which is the outermost layer, is formed on the interlayer insulating layer 53 to cover the wiring layer 54. The outermost wiring layer 56 is formed on the interlayer insulating layer 55 and electrically connected to the wiring layer 54 through via wires 59 extending through the interlayer insulating layer 55.

The via wires 57, 58, and 59 are tapered so that the diameter increases from the lower side (core 21) toward the upper side (outermost wiring layer 56) as viewed in FIG. 1. Each of the via wires 57, 58, and 59 are, for example, shaped into the forms of rods or truncated cones and has a diameter of 50 to 75 μm. Each of the wiring layers 52, 54, 56 has a thickness of, for example, 15 to 35 μm. The thickness from the first surface (e.g., upper surface) of the wiring layer 52 to the first surface (e.g., upper surface) of the interlayer insulating layer 53 and the thickness from the first surface (e.g., upper surface) of the wiring layer 54 to the first surface (e.g., upper surface) of the interlayer insulating layer 55 are, for example, about 15 to 35 μm. The wiring layers 52, 54, and 56 and the via wires 57, 58, and 59 may be formed from, for example, copper or copper alloy. The interlayer insulating layers 53 and 55 may be formed from, for example, an insulative resin such as epoxy resin or polyimide resin, or a composite resin material in which a filler such as silica, alumina, and the like is mixed with the insulative resin.

The solder resist layer 24 is stacked on the first surface (e.g., upper surface) of the interlayer insulating layer 55 of the outermost layer (e.g., uppermost layer). The solder resist layer 24 is formed from, for example, an insulative resin such as epoxy resin, acryl resin, or the like. The solder resist layer 24 includes openings 24X exposing portions of the wiring layer 56 of the uppermost layer as pads P1. Each pad P1 is flip-chip connected to a bump 12 of the semiconductor chip 11. In the wiring substrate 20, the surface on which the pads P1 are formed functions as a chip mounting surface.

When necessary, an Organic Solderability Preservative (OSP) process may be performed on the wiring layer 56 exposed from the opening 24X to form an OSP film, and the semiconductor chip 11 may be connected to the OSP film. A metal layer may be formed on the wiring layer 56 exposed from the opening 24X, and the semiconductor chip 11 may be connected to the metal layer. An example of the metal layer includes a gold (Au) layer, a nickel (Ni) layer/Au layer (metal layer in which Ni layer and Au layer are stacked in this order on the wiring layer 56), an Ni layer/palladium (Pd) layer/Au layer (metal layer in which Ni layer, Pd layer, and Au layer are stacked in this order on the wiring layer 56), and the like. The Ni layer, Au layer, and Pd layer may be metal layers (non-electrolytic plating metal layers) formed through a non-electrolytic plating process, for example. The Au layer is a metal layer including Au or Au alloy, the Ni layer is a metal layer including Ni or Ni alloy, and the Pd layer is a metal layer including Pd or Pd alloy.

The wiring structure 23 is stacked on the second surface 36B of the insulating layer 36. In the wiring structure 23, the wiring layer and the interlayer insulating layer are alternately stacked. The wiring layer may have any number of layers. The interlayer insulating layer has a thickness that insulates the wiring layers from each other. In the wiring structure 23 of the present example, an interlayer insulating layer 61, a wiring layer 62, an interlayer insulating layer 63, a wiring layer 64, an interlayer insulating layer 65, and a wiring layer 66 are stacked in this order.

The interlayer insulating layer 61 fills the cavity 21Y in cooperation with the insulating layer 45. The interlayer insulating layer 61 covers the second surface 36B of the insulating layer 36, and a second surface 38B (e.g., lower surface) of the wiring layer 38. The interlayer insulating layer 61 is formed on second surface 45B (e.g., lower surface) of the insulating layer 45 in the cavity 21Y to fill the portion of the cavity 21Y that is not filled with the insulating layer 45. Accordingly, the interlayer insulating layer 61 fills the space formed by the second surface 45B of the insulating layer 45 and the inner walls of the cavity 21Y below the second surface 45B. The interlayer insulating layer 61 is preferably formed from, for example, an insulative resin having a higher insulating capability than the interlayer insulating layer 51, and is, for example, an insulative resin such as epoxy resin or polyimide resin. The thickness from the second surface 38B of the wiring layer 38 to the second surface 61B of the interlayer insulating layer 61 is, for example, set to be the same as the thickness from the first surface 37A of the wiring layer 37 to the first surface 51A of the interlayer insulating layer 51 described above. In other words, the thickness of the insulating layer 45 and thickness of the interlayer insulating layer 61 formed on the wiring layer 38 are set to be the same as the thickness of the interlayer insulating layer 51 formed on the wiring layer 37. For example, the thickness from the second surface 38B of the wiring layer 38 to the second surface 61B of the interlayer insulating layer 61 is set to about 15 to 35 μm. The second surface 45B of the insulating layer 45 may be referred to as the boundary plane of the insulating layer 45 and the interlayer insulating layer 61. The insulating layer 45 may be referred to as the upper resin layer, and the interlayer insulating layer 61 may be referred to as the lower resin layer.

Via holes VH2 extend through the interlayer insulating layer 61 in the thicknesswise direction of the interlayer insulating layer 61 to expose the second surface 38B of the wiring layer 38. The via holes VH2 may be referred to as the second via holes.

The wiring layer 62 is stacked on the second surface 61B of the interlayer insulating layer 61. The wiring layer 62 is electrically connected to the wiring layer 38 through via wires 67 filled in the via holes VH2. The wiring layer 62 is electrically connected to the wiring layer 38 through the via wires 67 extending through the interlayer insulating layer 61 and the insulating layer 45.

In the same manner, the interlayer insulating layer 63 is formed on the second surface 61B of the interlayer insulating layer 61 so as to cover the wiring layer 62. The wiring layer 64 is formed on the second surface (e.g., lower surface) of the interlayer insulating layer 63 and is electrically connected to the wiring layer 62 through via wires 68 extending through the interlayer insulating layer 63. The interlayer insulating layer 65, which is the outermost layer, is formed on the second surface of the interlayer insulating layer 63 to cover the wiring layer 64. The wiring layer 66 of the outermost layer is formed on the second surface (e.g., lower surface) of the interlayer insulating layer 65 and electrically connected to the wiring layer 64 through via wires 69 extending through the interlayer insulating layer 65.

The via wires 67, 68, and 69 are tapered so that the diameter increases from the upper side (core 21) toward the lower side (wiring layer 66) as viewed in FIG. 1. Each of the via wires 67, 68, and 69 are, for example, shaped into the forms of rods or truncated cones and has a diameter of 50 to 75 μm. The thickness of the wiring layers 62, 64, 66 is, for example, 15 to 35 μm. The thickness from the second surface of the wiring layer 62 to the second surface of the interlayer insulating layer 63 and the thickness from the second surface of the wiring layer 64 to the second surface of the interlayer insulating layer 65 are, for example, about 15 to 35 μm. The wiring layers 62, 64, and 66 and the via wires 67, 68, 69 may be formed from, for example, copper or copper alloy. The interlayer insulating layers 63, 65 may be formed from, for example, an insulative resin such as epoxy resin, polyimide resin, and the like, or a composite resin material in which a filler such as silica, alumina, and the like is mixed with the insulative resin.

The solder resist layer 25 is stacked on the second surface (e.g., lower surface) of the interlayer insulating layer 65, which is the outermost layer (e.g., lowermost layer). The solder resist layer 25 may be formed from, for example, an insulative resin such as epoxy resin, acryl resin, and the like. The solder resist layer 25 includes openings 25X that expose portions of the second surface (e.g., lower surface) of the wiring layer 66 of the lowermost layer as external connection pads P2. Each external connection pad P2 is connected to an external connection terminal 16 such as a solder ball, a lead pin, and the like that is used when mounting the semiconductor device 10 to a mounting substrate such as a motherboard, and the like. When necessary, an OSP process may be performed on the wiring layer 66 exposed from the openings 25X to form an OSP film, and the external connection terminals 16 may be connected to the OSP film. A metal layer may be formed on the wiring layer 66 exposed from the openings 25X, and the external connection terminals 16 may be connected to the metal layer. An example of the metal layer includes an Au layer, a Ni layer/Au layer (metal layer in which Ni layer and Au layer are stacked in this order on the second surface of the wiring layer 66), an Ni layer/Pd layer/Au layer (metal layer in which Ni layer, Pd layer, and Au layer are stacked in this order on the second surface of the wiring layer 66), and the like. The wiring layer 66 (OSP film or metal layer when the OSP film and the metal layer are formed on the wiring layer 66) exposed from the openings 25X may function as the external connection terminals.

The semiconductor chip 11 is flip-chip mounted on the wiring substrate 20. In other words, the bumps 12 arranged on the circuit forming surface (lower surface in FIG. 1) of the semiconductor chip 11 are joined with the pads P1 of the wiring substrate 20. The bumps 12 electrically connect the semiconductor chip 11 to the wiring layer 56 of the wiring substrate 20.

The semiconductor chip 11 may be, for example, a logic chip such as a Central Processing Unit (CPU) chip, a Graphics Processing Unit (GPU) chip, or the like. Further, the semiconductor chip 11 may be, for example, a memory chip such as a Dynamic Random Access Memory (DRAM) chip, a Static Random Access Memory (SRAM) chip, a flash memory chip, or the like. The size of the semiconductor chip 11 may be, for example, about 3 mm×3 mm to 12 mm×12 mm as viewed from above. The semiconductor chip 11 has a thickness of, for example, about 50 to 100 μm.

Each bump 12 may be, for example, a gold bump or a solder bump. The solder bump may be formed from, for example, an alloy containing lead (Pb), alloy of tin (Sn) and Au, alloy of Sn and Cu, alloy of Sn and Ag, alloy of Sn, Ag, and Cu, or the like.

The underfill resin 15 fills the gap between the first surface (e.g., upper surface) of the wiring substrate 20 and the second surface (e.g., lower surface) of the semiconductor chip 11. The underfill resin 15 may be formed from, for example, an insulative resin such as epoxy resin or the like.

The operation of the semiconductor device 10 will now be described.

The cavity 21Y is filled with two insulating layers, namely, the insulating layer 45 and the interlayer insulating layer 61.

For example, when forming the insulating layer 45 and the interlayer insulating layer 61 in different steps, before forming one of the insulating layers (e.g., interlayer insulating layer 61) in a latter step, the cavity 21Y is already partially filled with the other one of the insulating layers (e.g., insulating layer 45). Thus, even if the volume of the cavity 21Y increases, the volume of the space that is to be filled in the latter step by one of the insulating layers (e.g., interlayer insulating layer 61) is relatively small. Accordingly, compared to when filling the cavity 21Y having the same volume with a single insulating layer, the amount of each of the two insulating layers 45 and 61 may be reduced. Further, the two insulating layers 45 and 61 are able to fill the cavity 21Y in a preferable manner.

A manufacturing method of the wiring substrate 20 will now be described with reference to FIGS. 3A to 5C.

Figure 3A:
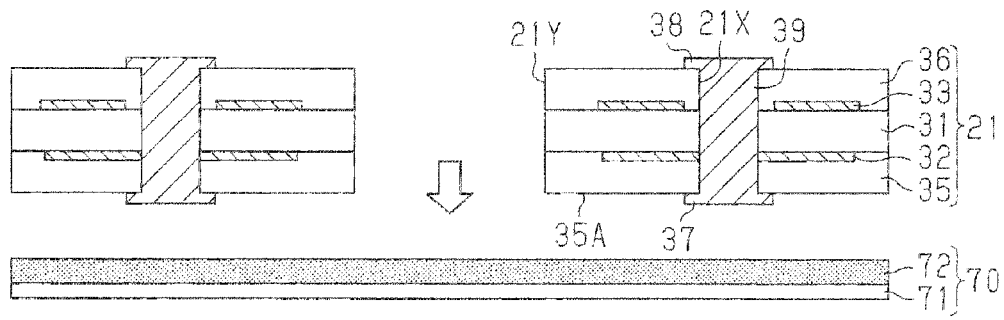
FIGS. 3A to 3D are schematic cross-sectional views illustrating a manufacturing method of the wiring substrate of the first embodiment.

As illustrated in FIG. 3A, the core 21 that includes the cavity 21Y is first prepared. The core 21 may be manufactured, for example, as described below. Using the known art, a printed wiring board may be formed including the core substrate 31 and the wiring layers 32 and 33 and the insulating layers 35 and 36 respectively formed on the first surface (e.g., lower surface) and the second surface (e.g., upper surface) of the core substrate 31, the wiring layers 37 and 38 respectively formed on the outer surfaces of the insulating layers 35 and 36, and the through-core electrodes 39. Then, the cavity 21Y is formed to open at locations corresponding to the mounting position of the chip capacitor 40 (see FIG. 1) in the formed printed wiring board. This completes the core 21. The cavity 21Y may be formed, for example, by performing router processing, die processing that uses a die, laser processing, drilling, or the like.

As illustrated in FIG. 3A, an adhesive sheet or an adhesive tape 70 including a film or a tape base 71 and an adhesive layer 72 applied to an upper surface 71A of the tape base 71 is prepared. The adhesive tape 70 is preferably formed from, for example, a material having superior chemical resistance and heat resistance. The tape base 71 may be formed from a material having satisfactory workability, for example, a polyimide resin or a polyester resin. The adhesive layer 72 is a viscous insulating layer and forms the insulating layer 45 when processed in a subsequent step. The adhesive layer 72 may be formed from, for example, an insulative resin such as an epoxy resin or a polyimide resin. The adhesive layer 72 is in a B-stage state (semi-cured state). The tape base 71 may have a thickness of, for example, about 30 to 50 μm. The adhesive layer 72 may have a thickness of, for example, 30 to 50 μm.

As illustrated in FIG. 3A, the adhesive tape 70 is arranged on the first surface 35A of the core 21 opposing the first surface 35A of the insulating layer 35. In the illustrated example, the adhesive tape 70 is arranged with the adhesive layer 72 facing upward so that the adhesive layer 72 faces the core 21.

Figure 3B:
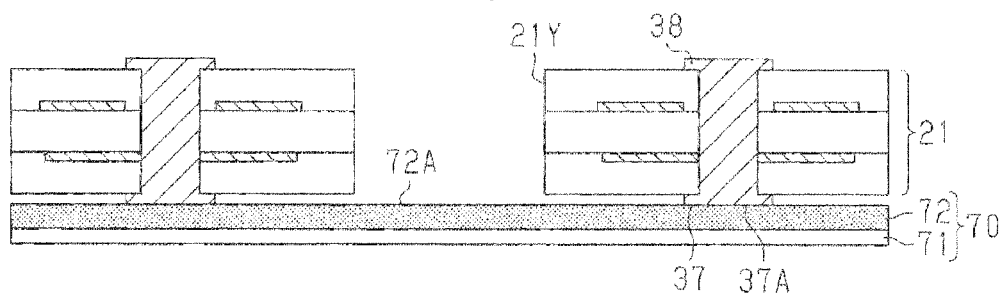

Then, as illustrated in FIG. 3B, the adhesive tape 70 is applied to the first surface 37A of the wiring layer 37 on the core 21. The adhesive layer 72 of the adhesive tape 70 is applied to the first surface 37A of the wiring layer 37. However, it is preferable that a gap be formed between the adhesive tape 70 and the insulating layer 35 of the core 21. For example, the adhesive tape 70 is laminated to the first surface 37A of the wiring layer 37 through thermal compression bonding. Under this situation, the adhesive layer 72 is still in the B-stage state.

Figure 3C:
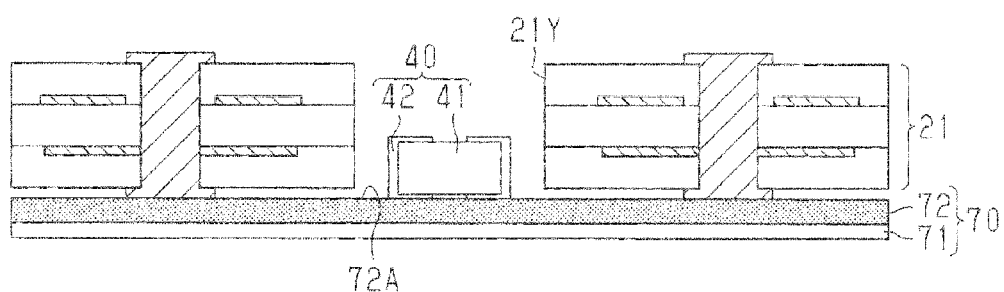

Then, as illustrated in FIG. 3C, using, for example, a mounter, the chip capacitor 40 is mounted on the adhesive layer 72 of the adhesive tape 70 exposed in the cavity 21Y of the core 21.

Figure 3D:
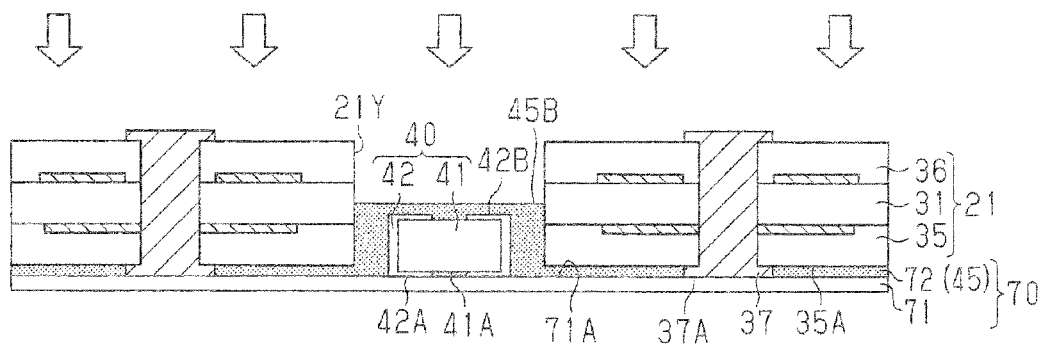

Subsequently, referring to FIG. 3D, when the structure illustrated in FIG. 3C is heated to 110° C. to 160° C., the chip capacitor 40 and the core 21 are pressed against the adhesive tape 70 (adhesive layer 72). As a result, the first surface 35A of the core 21, the first surface 37A of the wiring layer 37, the first surface 41A of the capacitor body 41, and the first surface 42A of each connection terminal 42 press the adhesive layer 72, which is in the semi-cured state. This spreads the adhesive layer 72 in the planar direction. The spread adhesive layer 72 enters the cavity 21Y so that the space between the chip capacitor 40 and the wall of the cavity 21Y is partially filled with the adhesive layer 72. In the illustrated example, the adhesive layer 72 in the cavity 21Y entirely covers the chip capacitor 40. In this manner, when the chip capacitor 40 is pressed against the adhesive layer 72, the chip capacitor 40 is entirely buried in the semi-cured adhesive layer 72. In this step, the chip capacitor 40 and the core 21 are pressed against the adhesive tape 70 until the first surface 42A of each connection terminal 42 and the first surface 37A of the wiring layer 37 contacts the upper surface 71A of the tape base 71.

Then, the adhesive layer 72 undergoes, for example, a thermosetting process. This thermally cures the adhesive layer 72 that forms the insulating layer 45. In one example, the insulating layer 45 entirely covers the chip capacitor 40, and the second surface 45B (e.g., upper surface) of the insulating layer 45 is located above the second surface 42B of each connection terminal 42. By thermally curing the adhesive layer 72, the insulating layer 45, the core 21, and the chip capacitor 40 are adhered and integrated to one another.

Figure 4A:
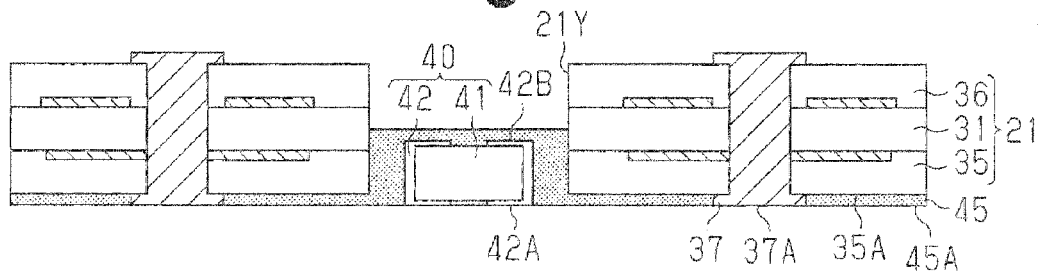
FIGS. 4A, 4C, and 4D are schematic cross-sectional views illustrating the manufacturing method of the wiring substrate of the first embodiment.
Figure 4B:
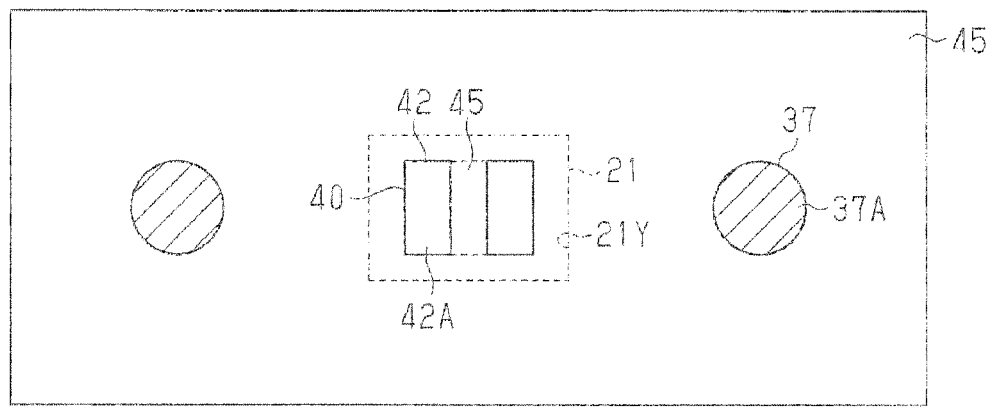
FIG. 4B is a schematic plan view illustrating the manufacturing method of the wiring substrate of the first embodiment.

As illustrated in FIG. 4A, the tape base 71 of the adhesive tape 70 is removed from the core 21 so that the insulating layer 45 remains adhered to the core 21 and the chip capacitor 40. The insulating layer 45 covers the first surface 35A of the insulating layer 35, portions of the walls of the cavity 21Y, side surfaces of the wiring layer 37, the second surface 42B and side surfaces of each connection terminal 42, and the entire surface of the capacitor body 41 exposed from each connection terminal 42. The first surface 42A of each connection terminal 42 and the first surface 37A of the wiring layer 37, which come into contact with the upper surface 71A of the tape base 71 in the step of FIG. 3D, are exposed from the insulating layer 45.

As illustrated in FIG. 4A, the first surface 42A of each connection terminal 42 projects toward the lower side from the first surface 35A of the core 21. Further, the first surface 45A of the insulating layer 45, the first surface 42A of each connection terminal 42, and the first surface 37A of the wiring layer 37 are substantially flush with one another extending along the upper surface 71A of the tape base 71 and form a flat plane.

In this manner, the adhesive layer 72 on the tape base 71 is not removed from the core 21 and is used as the insulating layer 45. Thus, in the illustrated example, the first surface 45A of the insulating layer 45 is formed on the same plane as the first surface 42A of each connection terminal 42. In another example, the first surface 45A is formed below the first surface 42A.

Subsequently, a roughening process is performed on the connection terminals 42 and the wiring layer 37 exposed from the insulating layer 45. The roughening process is performed to set the surface roughness Ra of the first surface 42A of each connection terminal 42 and the first surface 37A of the wiring layer 37 to about 0.5 to 2 μm. The surface roughness Ra is also referred to as the arithmetic average roughness, which is an arithmetic average value of the height (absolute value) from the average surface level measured at various positions within a predetermined measurement region. In the present step, fine pits and valleys are formed in the first surface 42A of each connection terminal 42 and the first surface 37A of the wiring layer 37 to roughen the first surface 42A of each connection terminal 42 and the first surface 37A of the wiring layer 37. The roughening process is performed so that the interlayer insulating layer 51 is easily adhered to the connection terminal 42 and the wiring layer 37 in the next step illustrated in FIG. 4C. The roughening process may be, for example, an etching process, a CZ process, a blackening process (oxidation process), and a sandblast process. The roughening process also eliminates the residual of the removed tape base 71 from the first surface 42A of each connection terminal 42 and the first surface 37A of the wiring layer 37.

Figure 4C:
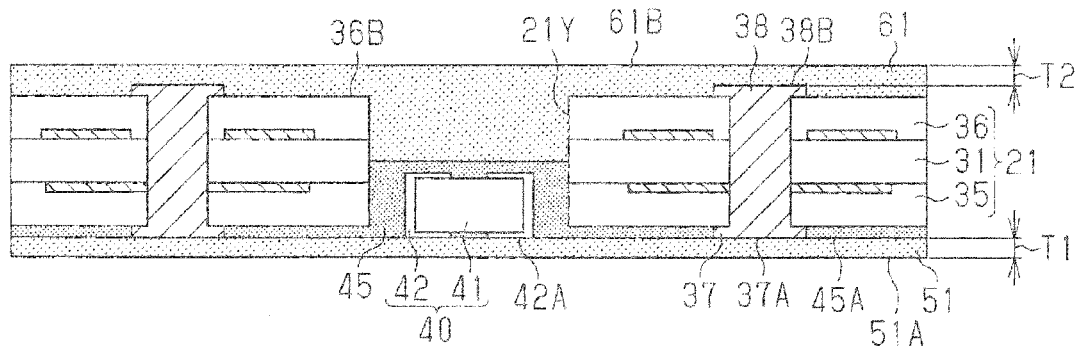

Then, as illustrated in FIG. 4C, the interlayer insulating layer 51 is formed on the first surface 45A of the insulating layer 45 to cover the first surface 45A of the insulating layer 45, the first surface 42A of each connection terminal 42, and the first surface 37A of the wiring layer 37. In the this step, the cavity 21Y exposed from the insulating layer 45 (for example, space formed by the second surface 45B of the insulating layer 45 and the wall located above the insulating layer 45 in the cavity 21Y) is filled with the interlayer insulating layer 61, which also covers the second surface 36B of the insulating layer 36 and the wiring layer 38. The cavity 21Y is partially filled with the insulating layer 45. Thus, the volume of the space filled with the insulating layer 61 is relatively small. Thus, even when the cavity 21Y has a large volume, the cavity 21Y may be filled with the interlayer insulating layer 61 in a further preferable manner than the related art. This prevents or reduces dishing in the interlayer insulating layer 61 above the cavity 21Y and flattens the second surface 61B of the interlayer insulating layer 61. The interlayer insulating layers 51 and 61 are formed through, for example, vacuum lamination or vacuum pressing.

In the present step, the chip capacitor 40 is buried in the insulating layer 45. This obviates displacement or the like of the chip capacitor 40 that would be caused by displacement of the pressure of the resin (resin for forming the interlayer insulating layer 61) flowing into the cavity 21Y. In the present manufacturing method, the insulating layer 45 (adhesive layer 72) is not removed and remains adhered to the chip capacitor 40 and the core 21. Under this situation, a further insulating layer, that is, the interlayer insulating layer 51, is stacked on the first surface 45A of the insulating layer 45. This omits the step for removing the insulating layer 45 (adhesive layer 72) and obviates the formation of an adhesive residual 91A (FIG. 12C) that may occur during removal of the adhesive layer 72.

In the present step, the thickness of the interlayer insulating layer 51 and the thickness of the interlayer insulating layer 61 are set so that the thickness T1 from the first surface 37A of the wiring layer 37 to the first surface 51A (e.g., lower surface) of the interlayer insulating layer 51 is substantially equal to the thickness T2 from the second surface 38B of the wiring layer 38 to the second surface 61B (e.g., upper surface) of the interlayer insulating layer 61. For example, when the thickness of each of the wiring layers 37 and 38 is 10 µm, the thickness of the interlayer insulating layer 51 is set to 25 µm and the thickness from the second surface 36B of the insulating layer 36 to the second surface 61B of the interlayer insulating layer 61 is set to 35 µm. This sets both of the thickness T1 and the thickness T2 to about 25 µm. By setting the thickness T1 to be the same as the thickness T2, the handling characteristics for forming wiring layers in subsequent steps may be improved.

Figure 4D:
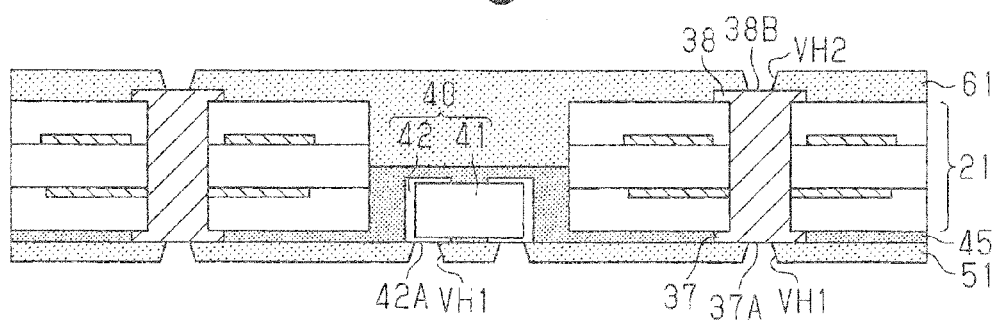

Then, as illustrated in FIG. 4D, the via holes VH1 are formed at certain locations in the interlayer insulating layer 51 to expose portions of the first surface 37A of the wiring layer 37 and portions of the first surface 42A of each connection terminal 42. The via holes VH2 are formed at certain locations in the interlayer insulating layer 61 to expose portions of the second surface 38B of the wiring layer 38. The via holes VH1 and VH2 may be formed through laser processing using, for example, $CO_2$ laser, UV-YAG laser, or the like. If the insulating layer 45 and the interlayer insulating layers 51 and 61 are formed using a photosensitive resin, the via holes VH1 and VH2 may be formed through, for example, photolithography.

When the via holes VH1 and VH2 are formed in a laser processing method, a desmear process is carried out to remove resin smear from the surfaces of the wiring layers 37 and 38 and the connection terminals 42 exposed at the bottom of the via holes VH1 and VH2.

Figure 5A:
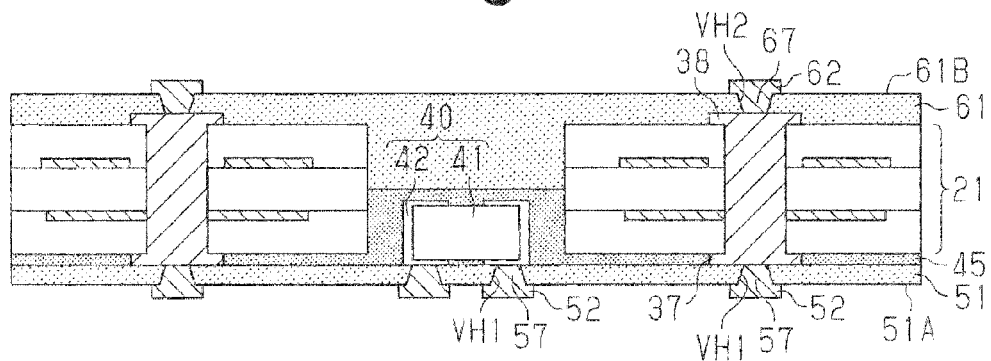
FIGS. 5A and 5B are schematic cross-sectional view illustrating the manufacturing method of the wiring substrate of the first embodiment.

Then, as illustrated in FIG. 5A, the via wires 57 are formed in the via holes VH1, and the wiring layer 52 electrically connected to the wiring layer 37 or the connection terminals 42 through the via wires 57 is stacked on the first surface 51A of the interlayer insulating layer 51. Further, the via wires 67 are formed in the via holes VH2, and the wiring layer 62 electrically connected to the wiring layer 38 through the via wires 67 is stacked on the second surface 61B of the interlayer insulating layer 61. The via wires 57 and 67 and the wiring layers 52 and 62 may be formed using various wire formation methods such as a semi-additive process, a subtractive process, or the like.

Figure 5B:
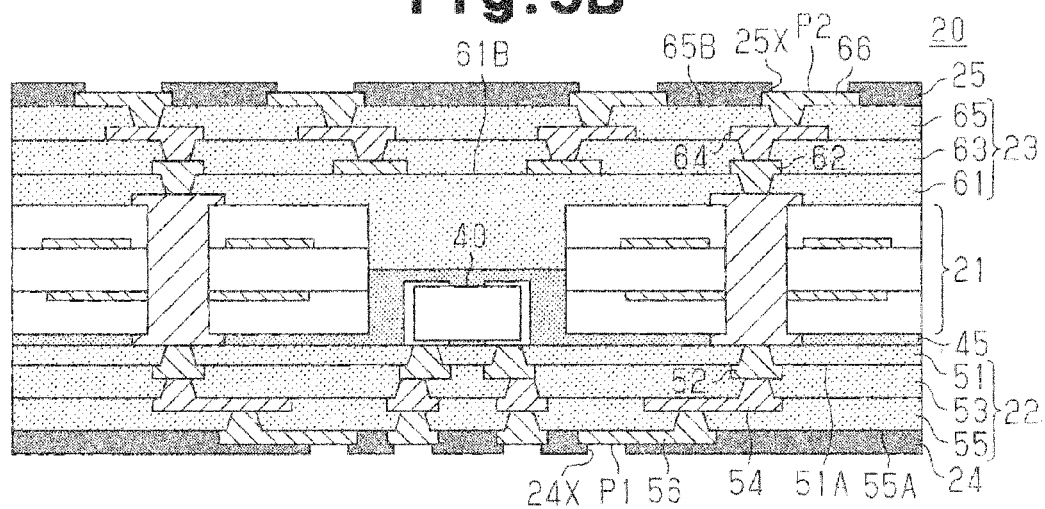

Then, as illustrated in FIG. 5B, the procedures of FIGS. 4C to 5A are repeated to alternately stack the interlayer insulating layers 53 and 55 and the wiring layers 54 and 56 on the first surface 51A of the interlayer insulating layer 51, and to alternately stack the interlayer insulating layers 63 and 65 and the wiring layers 62 and 64 on the second surface 61B of the interlayer insulating layer 61.

Subsequently, the solder resist layer 24 including the openings 24X for exposing the pads P1, formed at certain locations in the wiring layer 56, is stacked on the first surface 55A (e.g., lower surface) of the interlayer insulating layer 55. The solder resist layer 25 including the openings 25X for exposing the external connection pads P2, formed at certain locations in the wiring layer 66, is stacked on the second surface 65B (e.g., upper surface) of the interlayer insulating layer 65. The solder resist layers 24 and 25 may be formed, for example, by laminating a photosensitive solder resist film or applying a liquid solder resist and then patterning the resist to a certain shape. This exposes portions of the wiring layer 56 from the openings 24X of the solder resist layer 24 as the pads P1. This also exposes portions of the wiring layer 66 from the openings 25X of the solder resist layer 25 as the external connection pads P2. When necessary, a metal layer in which, for example, an Ni layer and an Au layer are stacked in this order may be formed on the pads P1 and the external connection pads P2. Such a metal layer may be formed, for example, through a non-electrolytic plating method. The wiring substrate 20 of FIG. 1 is manufactured through the above manufacturing steps.

A manufacturing method of the semiconductor device 10 will now be described with reference to FIG. 5C. The structure illustrated in FIG. 5C is reversed upside down from the structure illustrated in FIG. 5B.

Figure 5C:
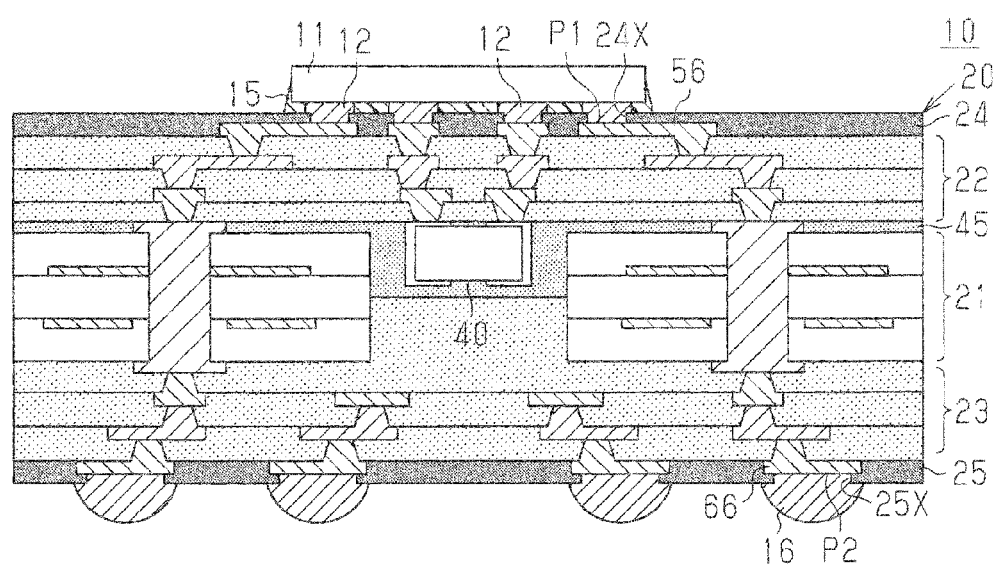
FIG. 5C is a schematic cross-sectional view illustrating a manufacturing method of a semiconductor device in the first embodiment.

As illustrated in FIG. 5C, the semiconductor chip 11 is first mounted on the wiring substrate 20, which is manufactured as described above. For example, the bumps 12 of the semiconductor chip 11 are flip-chip joined with the pads P1 of the wiring substrate 20. Then, the underfill resin 15 is filled and cured between the wiring substrate 20 and the semiconductor chip 11 that are flip-chip joined. The external connection terminals 16 are formed on the external connection pads P2. For example, after applying flux to the external connection pads P2, the external connection terminal 16 (e.g., solder ball) are mounted on the external connection pads P2 and fixed by performing a reflow process under a temperature of 240° C. to 260° C. Then, the surface is washed to remove the flux.

The semiconductor device 10 of FIG. 1 is manufactured through the manufacturing steps described above.

The first embodiment has the advantages described above.

(1) The chip capacitor 40 is pressed into the adhesive layer 72 to bury a portion of the chip capacitor 40 in the adhesive layer 72. This fills a portion of the cavity 21Y with the adhesive layer 72 (insulating layer 45). Then, the remainder of the cavity 21Y that is not filled with the insulating layer 45 is filled with the interlayer insulating layer 61. Accordingly, a portion of the cavity 21Y is filled with the insulating layer 45 before filling the cavity 21Y with the interlayer insulating layer 61. Thus, the volume of the space filled with the interlayer insulating layer 61 is relatively small. For this reason, even when the cavity 21Y has a large volume, the cavity 21Y may be filled with the interlayer insulating layer 61 in a further preferable manner. This prevents or reduces dishing in the interlayer insulating layer 61 above the cavity 21Y and flattens the second surface 61B of the interlayer insulating layer 61. Thus, a fine wiring layer 62 may be formed in a preferable manner on the second surface 61B of the interlayer insulating layer 61.

(2) The thickness T1 from the first surface 37A of the wiring layer 37 to the first surface 51A of the interlayer insulating layer 51 is set to be substantially the same as the thickness T2 from the second surface 38B of the wiring layer 38 to the second surface 61B of the interlayer insulating layer 61. This improves the handling property of the structure during the manufacturing process.

(3) The cavity 21Y is filled with the interlayer insulating layer 61 after a portion of the chip capacitor 40 is buried in the adhesive layer 72 (insulating layer 45). This prevents or reduces displacement of the chip capacitor 40 caused by the pressure of the resin that flows into the cavity 21Y. This improves the connection reliability of the chip capacitor 40 and the via wires 57.

Figure 12A:
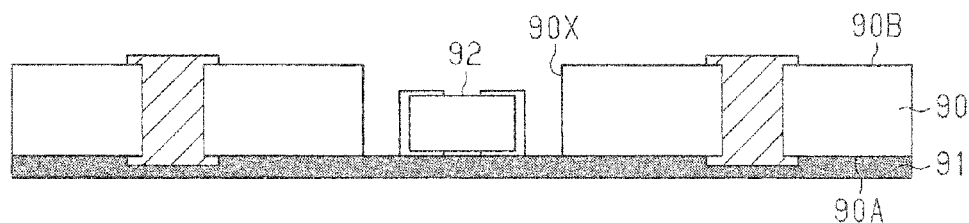
FIGS. 12A to 12D are schematic cross-sectional views illustrating a manufacturing method of a wiring substrate of the related art.
Figure 12B:
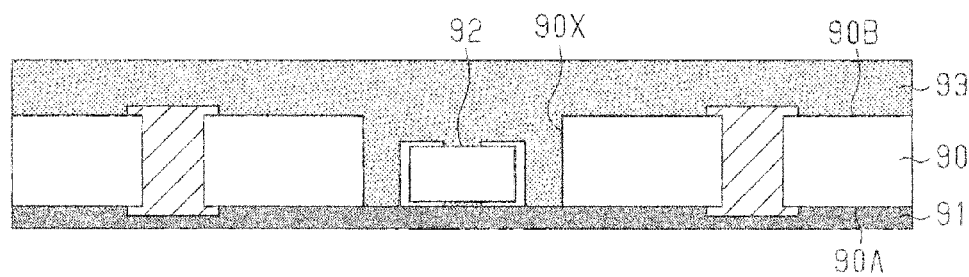
Figure 12C:
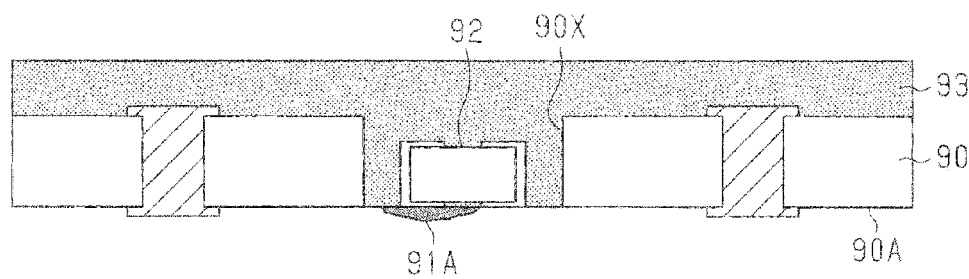
Figure 12D:
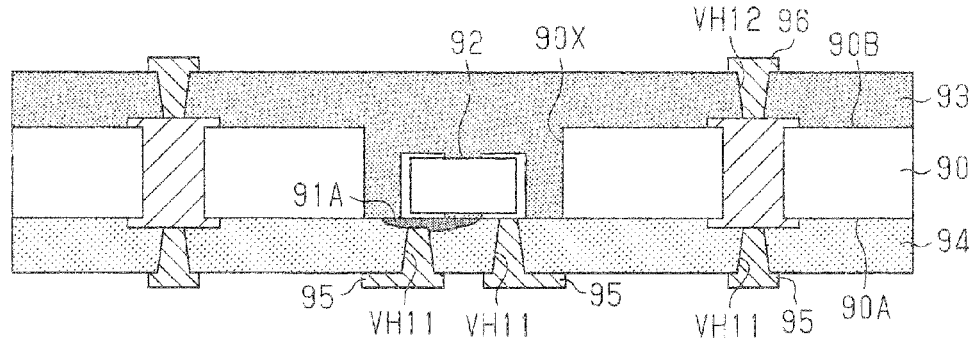

(4) In the manufacturing method of the conventional semiconductor device illustrated in FIGS. 12A to 12D, displacement of the electronic component 92 and the like when the cavity 90X is being filled with the insulating layer 93 is prevented or reduced by increasing the adhesive force (adhesion strength) of the tape 91. In such a case, however, removal of the tape 91 from the core substrate 90 may form a so-called adhesive deposit in which adhesive residual 91A of the adhesive that fixes the tape 91 remains on the lower surface of a connection terminal of the electronic component 92, as illustrated in FIG. 12C. The adhesive residual 91A adversely affects the electrical connection of the electronic component 92 and the wiring layer 95, as illustrated in FIG. 12D.

In this regards, in the illustrated embodiment, without removing the adhesive layer 72 (insulating layer 45), the insulating layer 45 is left adhered to the core 21 and the chip capacitor 40. Under this condition, a further insulating layer, that is, the interlayer insulating layer 51 is stacked on the first surface 45A of the insulating layer 45. This omits the step of removing the adhesive layer 72 and obviates the formation of the adhesive residual 91A. Thus, even when increasing the adhesive strength of the adhesive layer 72, the adhesive residual 91A may not be formed. Accordingly, the adhesive strength of the adhesive layer 72 may be increased to prevent or reduce displacement of the chip capacitor 40 when the cavity 21Y is being filled with the interlayer insulating layer 61.

(5) The first surface 42A of each connection terminal 42 contacts the upper surface 71A of the tape base 71. Thus, during removal of the adhesive tape 70 (tape base 71 and adhesive layer 72), the first surface 42A of each connection terminal 42 is in contact with the tape base 71 but not with the adhesive layer 72. This prevents or reduces residual of the adhesive layer 72 (insulating layer 45) on the first surface 42A of each connection terminal 42 after removal of the tape base 71. Thus, satisfactory electrical connection is obtained between the chip capacitor 40 and the wiring layer 52 (via wires 57).

(6) In the manufacturing method of the conventional semiconductor device illustrated in FIGS. 12A to 12D, the heat history differs between the insulating layer 93, with which the cavity 90X is filled and which covers the upper surface 90B of the core substrate 90, and the insulating layer 94, which covers the lower surface 90A of the core substrate 90 after removal of the tape 91. For example, the insulating layer 93 is exposed to heat twice such as during thermal curing, whereas the insulating layer 94 is exposed to heat once such as during thermal curing. The difference in the heat history between the insulating layers 93 and 94 results in different surface conditions between the insulating layers 93 and 94 located above and below the core substrate 90. This results in variations in the conditions for forming the wiring layers on the insulating layers 93 and 94.

In this regards, in the present example, the interlayer insulating layer 51, which is on the side of the first surface 35A of the core 21, and the interlayer insulating layer 61, which is on the side of the second surface 36B of the core 21, are simultaneously formed after removal of the tape base 71. Thus, the interlayer insulating layers 51 and 61, which are formed above and below the core 21, have the same heat history. In this manner, the wiring layers 52 and 62 on the interlayer insulating layers 51 and 61 are formed under uniform conditions. Accordingly, the wiring layers 52 and 62 are formed on the interlayer insulating layers 51 and 61 in a preferable manner.

It should be apparent to those skilled in the art that the present invention may be embodied in many other specific forms without departing from the spirit or scope of the invention. Particularly, it should be understood that the present invention may be embodied in the following forms.

The first surface 42A of each connection terminal 42 of the chip capacitor 40 may not be flush with the first surface 37A of the wiring layer 37. For example, in a first modification, the first surface 42A of each connection terminal may project from the first opening of the cavity 21Y to a higher position than the first surface 37A of the wiring layer 37. A manufacturing method of the wiring substrate in a first modification will now be described.

Figure 6A:
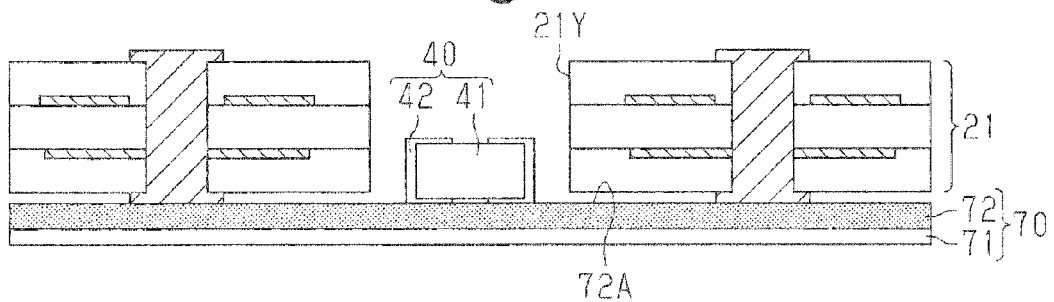
FIGS. 6A to 6D, 7A, and 7B are schematic cross-sectional views illustrating a manufacturing method of a wiring substrate of a first modification.

First, referring to FIG. 6A, steps that are similar to those illustrated in FIGS. 3A to 3C are performed to mount the core 21 and the chip capacitor 40 on the upper surface 72A of the adhesive layer 72 of the adhesive tape 70.

Figure 6B:
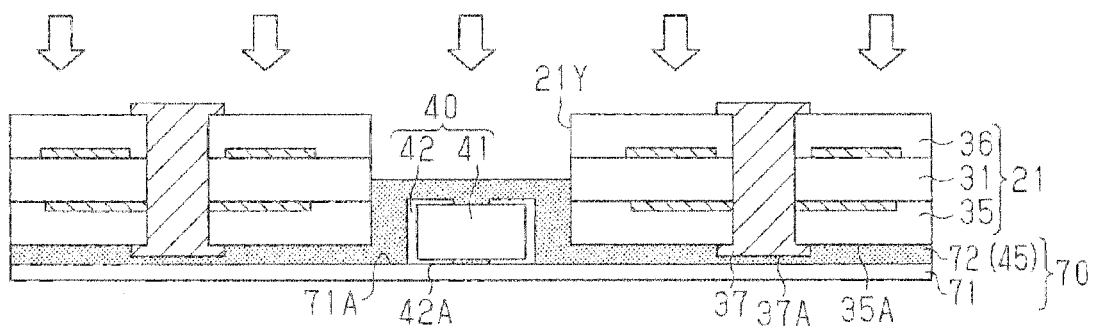

Then, referring to FIG. 6B, when the structure illustrated in FIG. 6A is heated under a temperature of 110° C. to 160° C., the chip capacitor 40 and the core 21 are pressed against the adhesive tape 70 (adhesive layer 72). The chip capacitor 40 is pressed against the adhesive tape 70 until the first surface 42A of each connection terminal 42 contacts the upper surface 71A of the tape base 71. This entirely buries the chip capacitor 40 of the illustrated example in the adhesive layer 72. In the present step, the first surface 37A of the wiring layer 37 does not contact the upper surface 71A of the tape base 71. That is, the wiring layer 37 is buried in the adhesive layer 72 so that the first surface 37A of the wiring layer 37 is located at an intermediate position in the thicknesswise direction of the adhesive layer 72. The present step projects the first surface 42A of each connection terminal 42 from the first surface 37A of the wiring layer 37 toward a direction opposite to the second surface 36B of the core 21 in a direction opposite to the second surface 36B of the core 21 (toward the lower side).

Figure 6C:
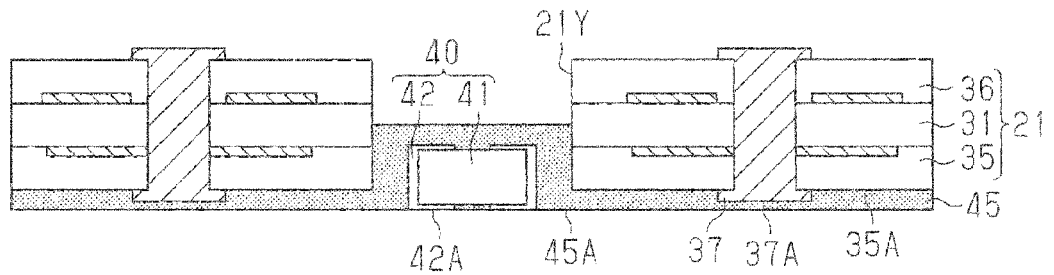

As illustrated in FIG. 6C, the tape base 71 illustrated in FIG. 6B is then removed from the adhesive layer 72. As a result, the insulating layer 45 covers the first surface 35A of the insulating layer 35, portions of the walls of the cavity 21Y, the first surface 37A and the side surfaces of the wiring layer 37, the second surface 42B and the side surfaces of each connection terminal 42, and all the surfaces of the capacitor body 41 exposed from each connection terminal 42. The first surface 42A of each connection terminal 42 is exposed from the insulating layer 45. Then, a roughening process is performed on each connection terminal 42 that is exposed from the insulating layer 45.

Figure 6D:
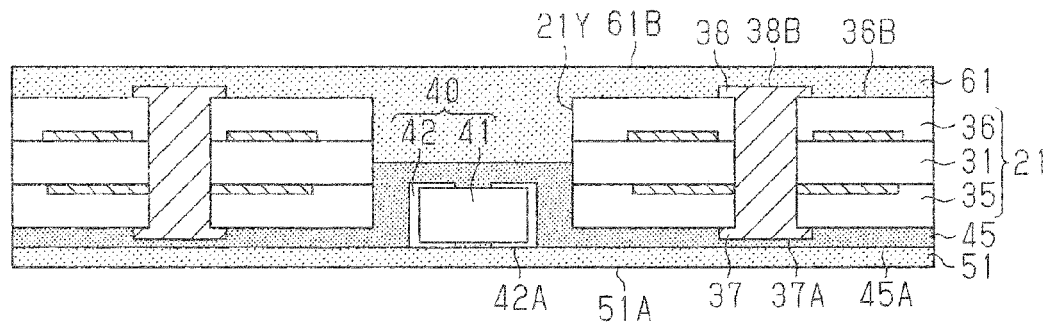

Then, referring to FIG. 6D, in the same manner as illustrated in FIG. 4C, the interlayer insulating layer 51 is formed on the first surface 45A of the insulating layer 45. This fills the cavity 21Y exposed from the insulating layer 45 with the interlayer insulating layer 51. Further, the interlayer insulating layer 61 is formed on the second surface 36B of the insulating layer 36. Preferably, the thickness of the interlayer insulating layer 51 and the thickness of the interlayer insulating layer 61 are set so that the thickness from the first surface 37A of the wiring layer 37 to the first surface 51A of the interlayer insulating layer 51 is substantially equal to the thickness from the second surface 38B of the wiring layer 38 to the second surface 61B of the interlayer insulating layer 61.

Figure 7A:
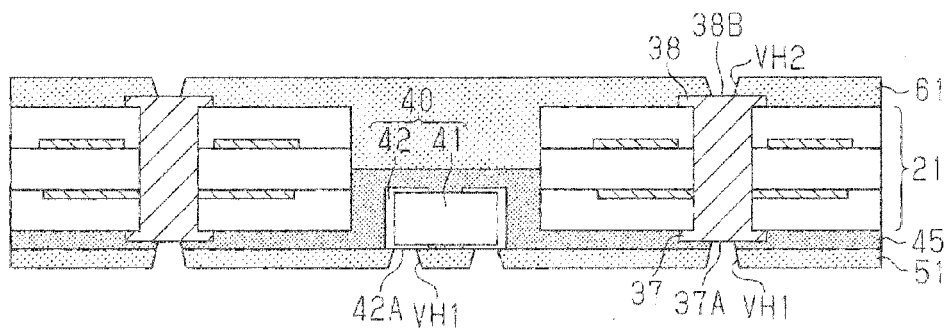

Next, referring to FIG. 7A, in the same manner as the step illustrated in FIG. 4D, for example, laser processing is performed to form the via holes VH1 at certain locations in the insulating layer 45 and the interlayer insulating layer 51 to expose portions of the first surface 37A of the wiring layer 37. The via holes VH1 extend through the insulating layer 45 and the interlayer insulating layer 51. Further, laser processing is performed to form the via holes VH2 at certain locations in the interlayer insulating layer 61 to expose portions of the second surface 38B of the wiring layer 38. The via holes VH2 extend through the interlayer insulating layer 61.

Figure 7B:
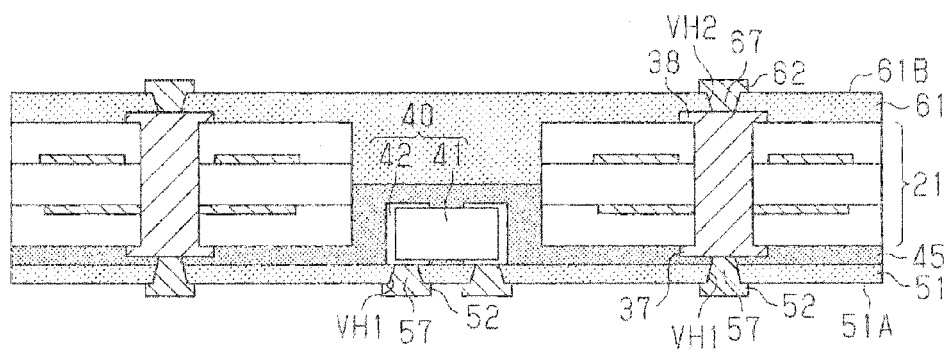

Then, referring to FIG. 7B, for example, a semi-additive process is performed to form the via wires 57 in the via holes VH1, and stack the wiring layer 52, which is electrically connected to the wiring layer 37 or the connection terminals 42 through the via wires 57, on the first surface 51A of the interlayer insulating layer 51. Further, for example, a semi-additive process is performed to form the via wires 67 in the via holes VH2, and stack the wiring layer 62, which is electrically connected to the wiring layer 38 through the via wires 67, on the second surface 61B of the interlayer insulating layer 61.

Figure 7C:
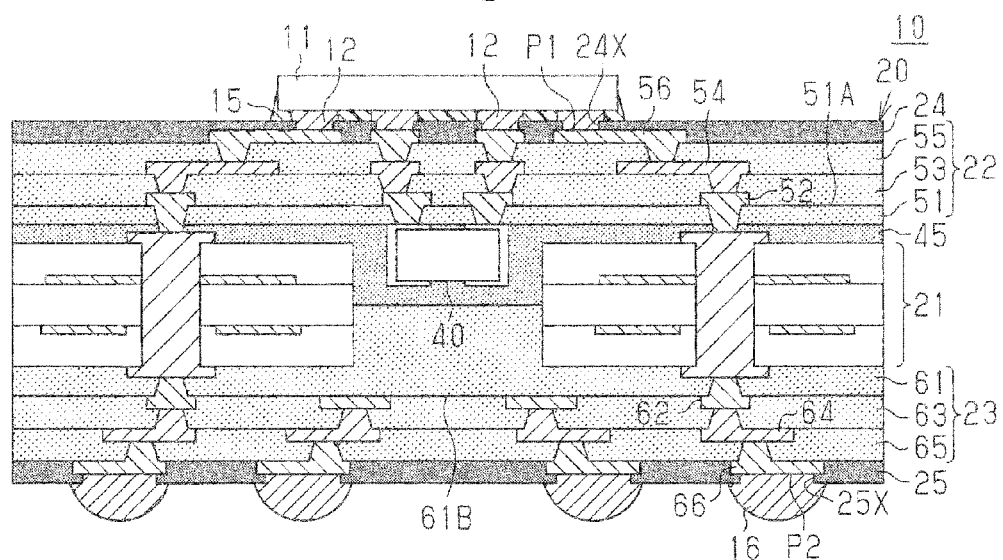
FIG. 7C is a schematic cross-sectional view illustrating the manufacturing method of a semiconductor device including the wiring substrate of the first modification.

Subsequently, steps similar to those illustrated in FIGS. 5B and 5C are performed to manufacture the wiring substrate 20 of the first modification and the semiconductor device 10 as illustrated in FIG. 7C.

The chip capacitor 40 may not be buried in the adhesive layer 72 so that the first surface 42A of each connection terminal 42 contacts the upper surface 71A of the tape base 71. For example, in a second modification, the chip capacitor 40 is buried in the adhesive layer 72 so that the first surface 42A of each connection terminal 42 does not contact the upper surface 71A of the tape base 71. A manufacturing method of a wiring substrate in a second modification will now be described.

Figure 8A:
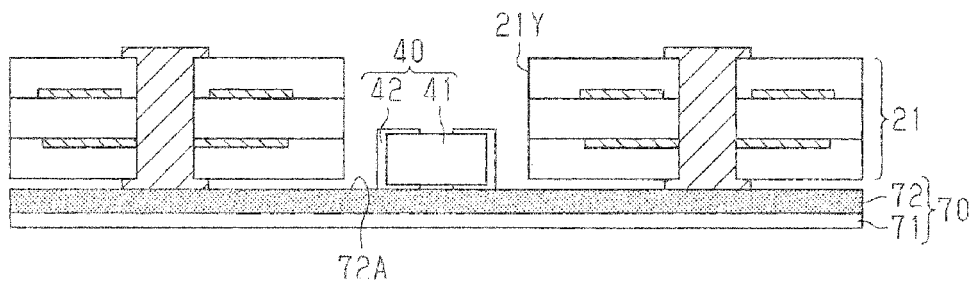
FIGS. 8A to 8D are schematic cross-sectional views illustrating a manufacturing method of a wiring substrate of a second modification.

First, referring to FIG. 8A, steps similar to those illustrated in FIGS. 3A to 3C are performed to mount the core 21 and the chip capacitor 40 on the upper surface 72A of the adhesive layer 72 of the adhesive tape 70.

Figure 8B:
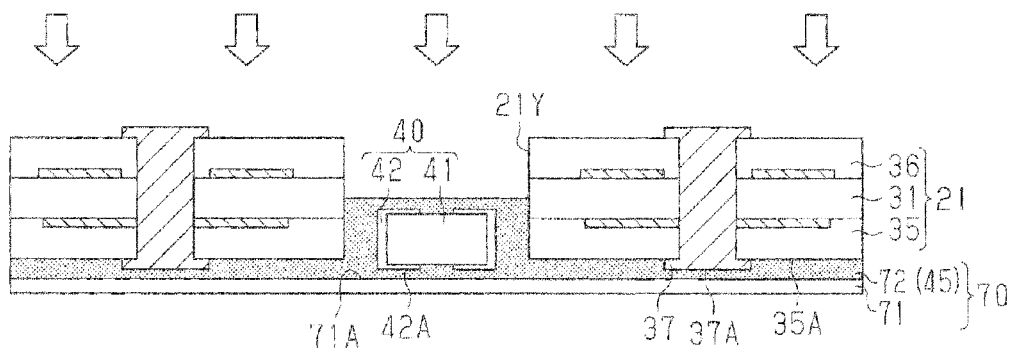

Then, referring to FIG. 8B, when the structure illustrated in FIG. 8A is heated under a temperature of 110° C. to 160° C., the chip capacitor 40 and the core 21 are pressed against the adhesive tape 70 (adhesive layer 72). Here, the first surface 42A of each connection terminal 42 does not contact the upper surface 71A of the tape base 71. That is, the connection terminals 42 are buried in the adhesive layer 72 so that the first surface 42A of each connection terminal 42 is located at an intermediate position in the thicknesswise direction of the adhesive layer 72. In the same manner as the connection terminals 42, in the illustrated example, the first surface 37A of the wiring layer 37 does not contact the upper surface 71A of the tape base 71. For example, the chip capacitor 40 and the core 21 are buried in the adhesive layer 72 so that the first surface 42A of each connection terminal 42 is flush with the first surface 37A of the wiring layer 37. Then, for example, the adhesive layer 72 is thermally cured to form the insulating layer 45.

Figure 8C:
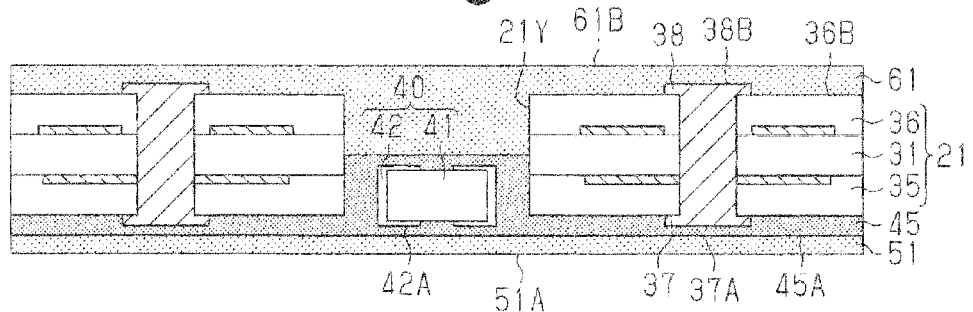

Referring to FIG. 8C, the tape base 71 illustrated in FIG. 8B is removed from the insulating layer 45. As a result, the insulating layer 45 covers the first surface 35A of the insulating layer 35, portions of the walls of the cavity 21Y, the first surface 37A and the side surfaces of the wiring layer 37, and all surfaces of the chip capacitor 40.

Then, in the same manner as illustrated in FIG. 4C, the interlayer insulating layer 51 is formed on the first surface 45A of the insulating layer 45. This fills the cavity 21Y exposed from the insulating layer 45 with the interlayer insulating layer 51. Further, the interlayer insulating layer 61 is formed on the second surface 36B of the insulating layer 36. The cavity 21Y exposed from the insulating layer 45 is filled with the interlayer insulating layer 61.

Figure 8D:
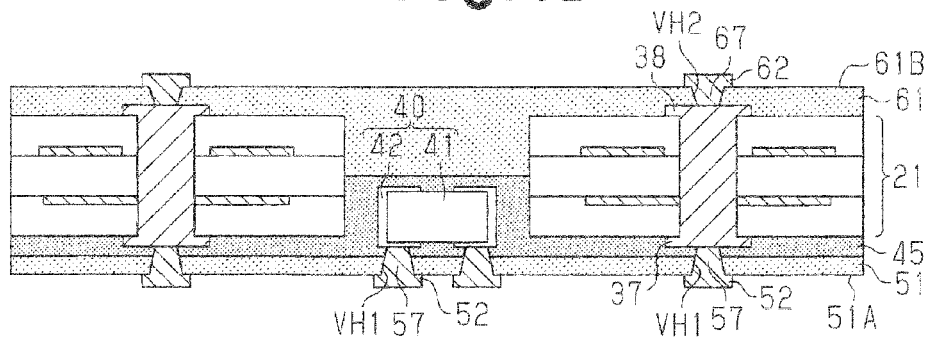

Referring to FIG. 8D, in the same manner as the steps illustrated in FIGS. 7A and 7B, the wiring layer 52 is formed on the first surface 51A of the interlayer insulating layer 51. The wiring layer 52 is connected to the wiring layer 37 or the connection terminals 42 through the via wires 57, which extend in the thicknesswise direction through the insulating layer 45 and the interlayer insulating layer 51. Further, the wiring layer 62 is formed on the second surface 61B of the interlayer insulating layer 61. The wiring layer 62 is connected to the wiring layer 38 through the via wires 67, which extend in the thicknesswise direction through the insulating layer 61.

Subsequently, steps similar to those illustrated in FIGS. 5B and 5C are performed to manufacture the wiring substrate 20 of the second modification and the semiconductor device 10.

In the above embodiment, the chip capacitor 40 may not be entirely buried in the adhesive layer 72. For example, in a third modification, only a portion of the chip capacitor 40 is buried in the adhesive layer 72, and a portion of the chip capacitor 40 is covered by the insulating layer 45 in the cavity 21Y.

For example, as illustrated in FIG. 9A, the insulating layer 45 may be formed to entirely cover the side surfaces of each connection terminal 42 of the chip capacitor 40. For example, in the cavity 21Y, the insulating layer 45 may be formed to fill the space between the wall of the cavity 21Y and the chip capacitor 40. In the illustrated example, the second surface 45B of the insulating layer 45 is substantially flush with the second surface 42B of each connection terminal 42. In this case, the second surface 42B of each connection terminal 42 and the second surface 41B of the capacitor body 41 are exposed from the insulating layer 45. In this case, the cavity 21Y exposed from the insulating layer 45 is filled with the interlayer insulating layer 61 that covers the second surface 42B of each connection terminal 42 and the second surface 41B of the capacitor body 41.

In this manner, the insulating layer 45 is formed in a portion of the cavity 21Y, for example, in a space between the wall of the cavity 21Y and the chip capacitor 40. This reduces the space that is filled with the interlayer insulating layer 61. Thus, advantage (1) of the above embodiment is obtained.

In the above embodiment and modifications, among the first surface 42A and the second surface 42B of each connection terminal 42, the via wires 57 are formed only at the side of the first surface 42A. Instead, for example, via wires may be formed at the two sides of the first surface 42A and the second surface 42B of each connection terminal 42. Such a wiring substrate may be formed as described below.

Figure 10A:
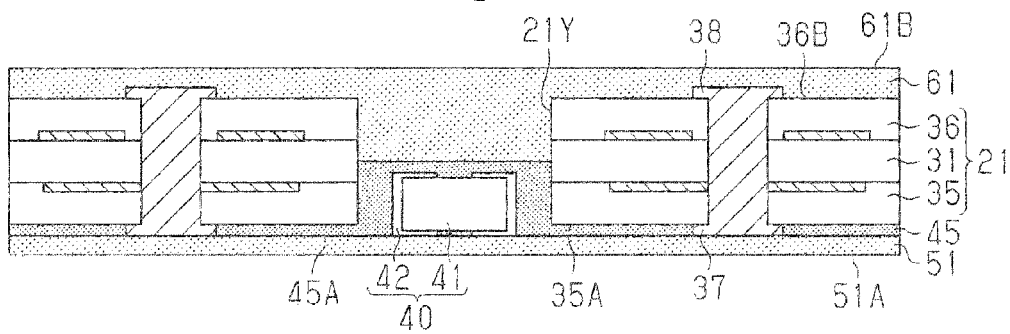
FIGS. 10A to 10C are schematic cross-sectional views illustrating a manufacturing method of a wiring substrate of a fifth modification.

First, as illustrated in FIG. 10A, steps similar to those illustrated in FIGS. 3A to 4C are performed to obtain a structure similar to that illustrated in FIG. 4C. For example, the interlayer insulating layer 51 is formed to cover the first surface 45A of the insulating layer 45, the first surface 42A of each connection terminal 42, and the first surface 37A of the wiring layer 37. Further, the interlayer insulating layer 61 is formed to cover second surface 36B of the core 21 and the wiring layer 38. The cavity 21Y exposed from the insulating layer 45 is filled with the interlayer insulating layer 61.

Figure 10B:
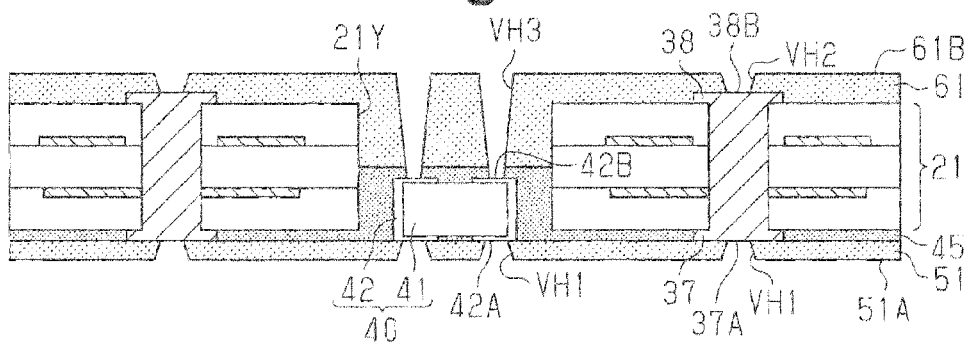

Then, referring to FIG. 10B, for example, laser processing is performed to form the via holes VH1 at certain locations in the interlayer insulating layer 51 to expose portions of the first surface 37A of the wiring layer 37 or a portion of the first surfaces 42A of each connection terminal 42. Further, for example, laser processing is performed to form the via holes VH2 at certain locations in the interlayer insulating layer 61 to expose portions of the second surface 38B of the wiring layer 38. Additionally, for example, laser processing is performed to form via holes VH3 at certain locations in the interlayer insulating layer 61 and the insulating layer 45 to expose portions of the second surface 42B of the connection terminals 42. The via holes VH3 extend through the interlayer insulating layer 61 and the insulating layer 45.

Figure 10C:
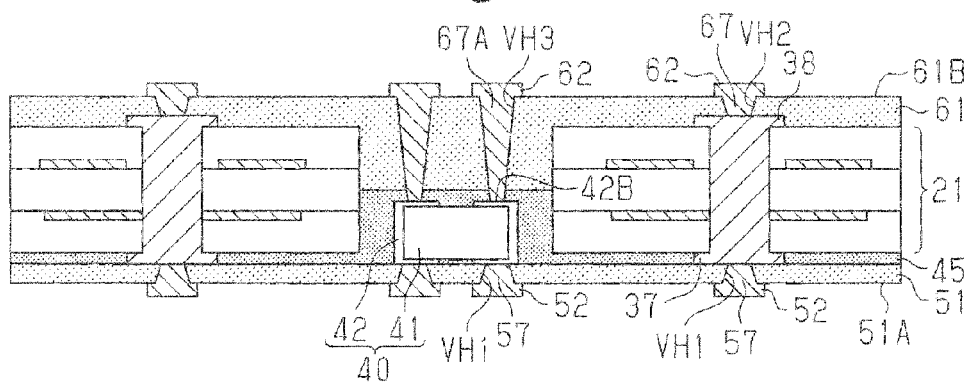

Then, referring to FIG. 10C, for example, a semi-additive process is performed to form the via wires 57 in the via holes VH1, and form the wiring layer 52, which is electrically connected to the wiring layer through the via wires 57, on the first surface 51A of the interlayer insulating layer 51. Further, for example, a semi-additive process is performed to form the via wires 67 in the via holes VH2, and stack the wiring layer 62, which is electrically connected to the wiring layer 38 through the via wires 67, on the second surface 61B of the interlayer insulating layer 61. Additionally, for example, a semi-additive process is performed to form via wires 67A in the via holes VH3, and stack the wiring layer 62, which is electrically connected to the wiring layer 38 through the via wires 67A, on the second surface 61B of the interlayer insulating layer 61.

Subsequently, steps similar to those illustrated in FIGS. 5B and 5C are performed to manufacture the wiring substrate and semiconductor device of the present modification.

The wiring substrate 20 of the above embodiment and modifications incorporates the chip capacitor 40, which is thinner than the core 21. Instead, the wiring substrate 20 may incorporate, for example, a chip capacitor 40 that is thicker than a core 21. Such a wiring substrate may be formed as described below.

Figure 11A:
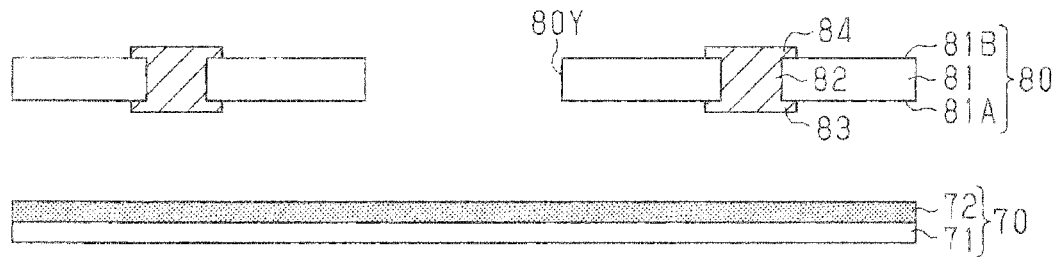
FIGS. 11A to 11D are schematic cross-sectional views illustrating a manufacturing method of a wiring substrate of a sixth modification.

As illustrated in FIG. 11A, a core 80 is first prepared. The core 80 may be manufactured, using the known art, to include a core substrate 81, through-core electrodes 82 extending through the core substrate 81 in the thicknesswise direction, a wiring layer 83 formed on a first surface 81A of the core substrate 81, and a wiring layer 84 formed on a second surface 81B of the core substrate 81 and connected to the wiring layer 83 through the through-core electrodes 82. Then, a cavity 80Y is formed in the core 80 (core substrate 81) to open at locations corresponding to the mounting position of the chip capacitor 40. The cavity 80Y may be formed, for example, by performing router processing, die processing that uses a die, laser processing, drilling, or the like.

As illustrated in FIG. 11A, an adhesive tape 70 is arranged at the side of the first surface 81A of the core 80, that is, the side of the first surface 81A of the core substrate 81. The adhesive tape 70 is arranged with the adhesive layer 72 facing toward the upper side so that the adhesive layer 72 faces the core substrate 81.

Figure 11B:
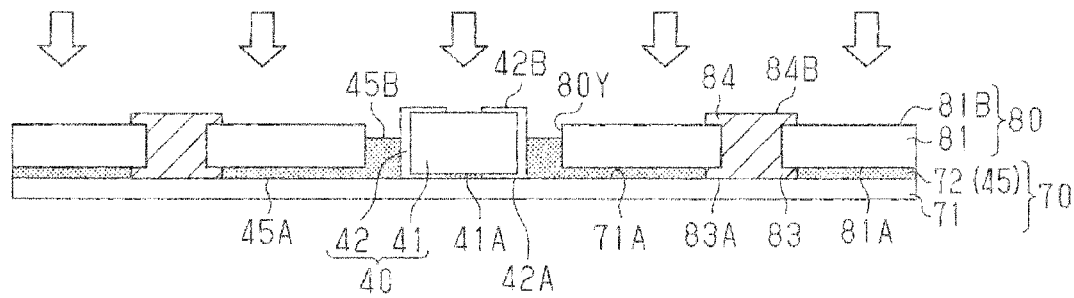

Then, referring to FIG. 11B, in the same manner as the steps illustrated in FIGS. 3B and 3C, the adhesive tape 70 is applied to the first surface 83A of the wiring layer 83 to obtain the structure in which the chip capacitor 40 is mounted on the adhesive layer 72 exposed from the cavity 80Y of the core 80. Then, in the same manner as the step illustrated in FIG. 3D, when the structure is heated to 110° C. to 160° C., the chip capacitor 40 and the core 80 are pressed against the adhesive tape 70 (adhesive layer 72). As a result, the first surface 81A of the core substrate 81, the first surface 83A of the wiring layer 83, the first surface 41A of the capacitor body 41, and the first surface 42A of each connection terminal 42 press the adhesive layer 72, which is in the semi-cured state. This spreads the adhesive layer 72 in the planar direction. The spread adhesive layer 72 enters the cavity 80Y so that the space between the chip capacitor 40 and the wall of the cavity 80Y is partially filled with the adhesive layer 72. In the illustrated example, the adhesive layer 72, which spreads in this manner, covers portions of the side surfaces of the chip capacitor 40, and the adhesive layer 72 covers portions of the walls of the cavity 21Y. In the present step, the chip capacitor 40 is pressed against the adhesive layer 72 until a portion of the chip capacitor 40 is buried in the adhesive layer 72, which is in the semi-cured state. Further, in the present steps, the chip capacitor 40 and the core 80 are pressed against the adhesive tape 70 until the first surface 42A of each connection terminal 42 and the first surface 83A of the wiring layer 83 contact the upper surface 71A of the tape base 71. Then, for example, a thermosetting process is performed thermally cure the adhesive layer 72 and form the insulating layer 45.

Consequently, in the chip capacitor 40 of the illustrated example, a portion of each connection terminal 42 at the side of the second surface 42B (e.g., upper surface) projects toward the upper side from the cavity 80Y. For example, the chip capacitor 40 projects toward the upper side from the second surface 81B of the core substrate 81 and from a second surface 84B (e.g., upper surface) of the wiring layer 84.

Figure 11C:
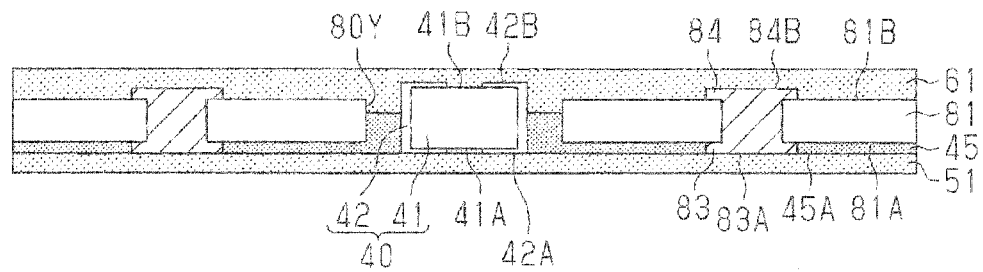

Then, as illustrated in FIG. 11C, the tape base 71 illustrated in FIG. 11B is removed from the adhesive layer 72. As a result, the insulating layer 45 covers the first surface 81A of the core substrate 81, portions of the walls of the cavity 80Y, the side surfaces of the wiring layer 83, portions of the side surfaces of the chip capacitor 40, and the first surface 41A of the capacitor body 41.

Next, in the same manner as the step illustrated in FIG. 4C, the interlayer insulating layer 51 is formed on the first surface 45A of the insulating layer 45. The interlayer insulating layer 61 is formed on the second surface 81B of the core substrate 81 to cover the chip capacitor 40, which is exposed from the insulating layer 45, and the wiring layer 84. Further, the cavity 80Y exposed from the insulating layer 45 is filled with the interlayer insulating layer 61. The interlayer insulating layer 61 entirely covers the chip capacitor 40 exposed from the insulating layer 45. That is, the chip capacitor 40 exposed from the insulating layer 45 is buried in the interlayer insulating layer 61. In other words, even when a portion of the chip capacitor 40 projects toward the upper side from the second surface 81B of the core substrate 81, the projecting chip capacitor 40 may be buried in the interlayer insulating layer 61. The thickness corresponding to the projecting amount may be absorbed by the interlayer insulating layer 61.

Figure 11D:
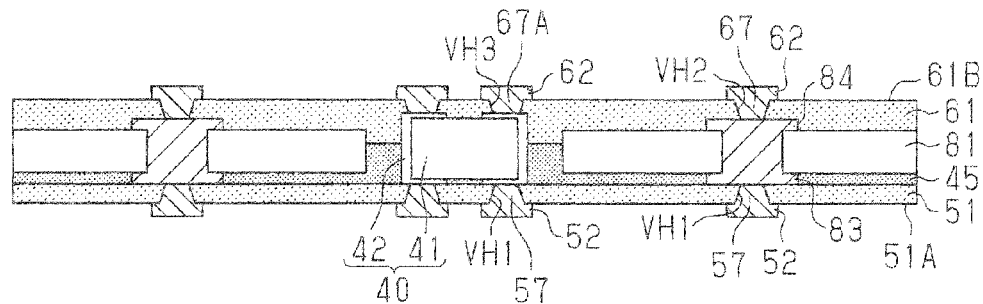

Then, referring to FIG. 11D, in the same manner as the steps illustrated in FIGS. 4D and 5A, for example, a semi-additive process is performed to form the wiring layer 52, which is connected to the wiring layer 83 or the connection terminals 42 through the via wires 57 extending through the interlayer insulating layer 51 in the thicknesswise direction, on the first surface 51A of the interlayer insulating layer 51. Further, for example, a semi-additive process is performed to form the wiring layer 62, which is connected to the wiring layer 84 through the via wires 67 extending through the interlayer insulating layer 61 in the thicknesswise direction, on the second surface 61B of the interlayer insulating layer 61. Additionally, for example, a semi-additive process is performed to form the wiring layer 62, which is connected to the connection terminals 42 through the via wires 67A extending through the interlayer insulating layer 61 in the thicknesswise direction, on the second surface 61B of the interlayer insulating layer 61.

Subsequently, steps similar to those illustrated in FIGS. 5B and 5C are performed to manufacture the wiring substrate and the semiconductor device of the present modification.

In the above embodiments and modifications, the chip capacitor 40 including the two connection terminals 42 is incorporated in the wiring substrate 20. Instead, for example, an electronic component such as a capacitor including three or more connection terminals 42 may be incorporated in the wiring substrate 20.

In the above embodiments and modifications, the chip capacitor 40 is incorporated in the wiring substrate 20. However, an electronic component such as a chip resistor, an inductor, a semiconductor device (LSI), and the like may be incorporated in the wiring substrate 20.

In the above embodiments and modifications, one electronic component (chip capacitor 40) is incorporated in the wiring substrate 20. Instead, a wiring substrate may incorporate, for example, two or more electronic components. Further, more than one type of electronic component may be incorporated in the same wiring substrate.

In the above embodiments and the modifications, the structure of the core 21 at the inner side of the outermost wiring layers 37 and 38 is not particularly limited. In the same manner, the structure of the core 80 at the inner side of the outermost wiring layers 83 and 84 is not particularly limited. In other words, the structure of the cores 21 and 80 at the inner side of the outermost wiring layers is not particularly limited as long as at least the outermost wiring layers 37 and 38 (wiring layers 83 and 84) are electrically connected to each other through the interior of the substrate and the cavity 21Y (80Y) is formed. For example, the structure and the material of the core substrates 31 and 81 are not particularly limited. The number of wiring layers and insulating layers, the layout of the wiring, and the like at the inner side of the cores 21 and 80 may be changed in various manners. Alternatively, the core 21 may be a coreless substrate that does not include the core substrate 31.

In the above embodiments and modifications, the through-core electrodes 39 are formed to fill the through holes 21X. Instead, for example, the through-core electrodes 39 may be formed as conformal vias. In other words, the shape of the through-core electrode 39 is not particularly limited as long as the through-core electrode 39 covers the wall surface in each through hole 21X and electrically connects the wiring layers 37 and 38 respectively formed on the first surface 35A and the second surface 36B of the core 21. Similar changes may also be made to the through-core electrode 82.

The number of the wiring layers 52, 54, and 56 and the interlayer insulating layers 51, 53, and 55, the wiring layout, and the like in the wiring structure 22 of the above embodiments and modifications may be changed in various manners.

The number of wiring layers 62, 64, and 66 and the interlayer insulating layers 61, 63, and 65, the wiring layout, and the like in the wiring structure 23 of the above embodiments and modifications may be changed in various manners.

The cavities 21Y and 80Y of the cores 21 and 80 in the above embodiments and modifications is formed to have substantially rectangular cross-sections. Instead, for example, the cavities 21Y and 80Y may be formed to have substantially trapezoidal cross-sections in the same manner as the via holes VH1 and the like. Further, the cavities 21Y and 80Y may be formed to have substantially drum-shaped cross-sections.

The above embodiments and modifications are embodied in a manufacturing method of a single semiconductor device but may be embodied in a manufacturing method of a batch of semiconductor devices.

Changes may be made to the number of semiconductor chips on the wiring substrate 20 of the semiconductor device 10 in the above embodiments and modifications and the mounting mode of the semiconductor chip (e.g., flip-chip mounting, wire bonding, or a combination of flip-chip mounting and wire bonding) and the like.

For purposes of clarification and consistency between the description and the claims, it is noted that the chip capacitor 40, described above, corresponds to, and represent example of an electronic component recited in the claims. Similarly, the wiring layers 37 and 83 are each an example of a first wiring layer. The wiring layers 38 and 84 are each an example of a second wiring layer. The wiring layer 52 is an example of a third wiring layer. The wiring layer 62 is an example of a fourth wiring layer. The insulating layer 45 is an example of a first insulating layer. The interlayer insulating layer 51 is an example of a second insulating layer. The interlayer insulating layer 61 is an example of a third insulating layer. The via wires 57 are each an example of a first via wire. The via wires 67 are each an example of a second via wire.

The disclosure further encompasses various example(s) described below.

[Clause 1] According to one embodiment, a manufacturing method of a wiring substrate includes: forming a cavity that extends through a core including a first surface, a second surface, a first wiring layer, and a second wiring layer, wherein the second surface is located at an opposite side of the first surface, the first wiring layer is formed on the first surface, and the second wiring layer is formed on the second surface; covering the cavity with a tape including an adhesive first insulating layer and a tape base, wherein the first insulating layer is adhered to the first surface of the core; arranging an electronic component on the first insulating layer exposed from the cavity; pushing the core and the electronic component so as to bury the part of the electronic component and the first surface of the core in the first insulating layer; removing the tape base from the core; forming a second insulating layer and a third insulating layer simultaneously, wherein the second insulating layer covers a first surface of the first insulating layer, which is located on the first surface of the core, wherein the third insulating layer covers the second surface of the core, and wherein a portion of the cavity is filled with the first insulating layer and the remainder of the cavity that is not filled with the first insulating layer is filled with the third insulating layer; forming a first via hole, which extends through at least the second insulating layer and exposes the electronic component, and a second via hole, which extends through the third insulating layer and exposes the second wiring layer; forming a first via wire in the first via hole; forming a third wiring layer on the second insulating layer, wherein the third wiring layer is electrically connected to the electronic component through the first via wire; forming a second via wire in the second via hole; and forming a fourth wiring layer on the third insulating layer, wherein the fourth wiring layer is electrically connected to the second wiring layer through the second via wire.

[Clause 2] In the method according to clause 1, it is preferable that the pushing the electronic component includes burying the electronic component in the first insulating layer until a connection terminal of the electronic component contacts the tape base.

[Clause 3] In the method according to clause 1, it is preferable that forming the second insulating layer and the third insulating layer includes setting a thickness of the second insulating layer and a thickness of the third insulating layer so that a thickness of the second insulating layer over the first wiring layer is equal to a thickness of the third insulating layer over the second wiring layer.

[Clause 4] In the method according to clause 1, it is preferable that the electronic component includes surfaces located in the cavity, and the pushing the electronic component includes entirely covering the surfaces of the electronic component located in the cavity with the first insulating layer.

The present examples and embodiments are to be considered as illustrative and not restrictive, and the invention is not to be limited to the details given herein, but may be modified within the scope and equivalence of the appended claims.

The invention claimed is:

1. A wiring substrate comprising:
 a core including a first surface, a second surface, and a cavity, wherein the second surface is located at an opposite side of the first surface, and the cavity extends through the core in a thicknesswise direction and includes a first opening in the first surface and a second opening in the second surface;
 a first wiring layer formed on the first surface of the core;
 a second wiring layer formed on the second surface of the core;
 an electronic component partially accommodated in the cavity and including a projected portion projected from the first opening of the core;
 a first insulating layer covering over the first wiring layer and the first surface of the core, wherein the first insulating layer covers at least a portion of a side surface of the electronic component and fills a portion of the cavity;
 a second insulating layer that covers a first surface of the first insulating layer;
 a plurality of first via wires each extending through the first and second insulating layers in the thicknesswise direction, wherein the first wiring layer and the electronic component are electrically connected to different ones of the plurality of first via wires;
 a third insulating layer that covers the second surface of the core, wherein the remainder of the cavity that is not filled with the first insulating layer is filled with the third insulating layer;
 a third wiring layer formed on the second insulating layer and electrically connected to the electronic component and the first wiring layer through the different ones of the plurality of first via wires;
 a second via wire that extends through the third insulating layer; and
 a fourth wiring layer formed on the third insulating layer and electrically connected to the second wiring layer through the second via wire.

2. The wiring substrate according to claim 1, wherein a thickness of the second insulating layer over the first wiring layer is equal to a thickness of the third insulating layer over the second wiring layer.

3. The wiring substrate according to claim 1, wherein the first insulating layer entirely covers a side surface of the projected portion of the electronic component.

4. The wiring substrate according to claim 1, wherein
 the electronic component includes surfaces located in the cavity, and
 the first insulating layer entirely covers the surfaces of the electronic component located in the cavity.

5. The wiring substrate according to claim 1, wherein the first insulating layer includes a first portion sandwiched between the first wiring layer and the second insulating layer.

6. The wiring substrate according to claim 5, wherein
 the first insulating layer includes a second portion sandwiched between the first surface of the core and the second insulating layer,
 the first portion of the first insulating layer has a first thickness, and
 the second portion of the first insulating layer has a second thickness greater than the first thickness.

* * * * *